(12) United States Patent
Iwaki et al.

(10) Patent No.: US 8,766,744 B2
(45) Date of Patent: Jul. 1, 2014

(54) DUPLEXER AND ELECTRONIC DEVICE HAVING THE SAME

(75) Inventors: Masafumi Iwaki, Tokyo (JP); Motoaki Hara, Miyagi (JP); Tokihiro Nishihara, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 346 days.

(21) Appl. No.: 13/277,866

(22) Filed: Oct. 20, 2011

(65) Prior Publication Data

US 2012/0112854 A1   May 10, 2012

(30) Foreign Application Priority Data

Nov. 10, 2010   (JP) .................................. 2010-252268

(51) Int. Cl.
*H03H 9/00* (2006.01)
*H01L 41/00* (2013.01)

(52) U.S. Cl.
USPC ............................. 333/134; 333/126; 333/129

(58) Field of Classification Search
USPC .......................... 333/126–129, 132, 133, 134
See application file for complete search history.

(56) References Cited

U.S. PATENT DOCUMENTS

| 2006/0132260 A1 | 6/2006 | Iwamoto et al. |
| 2006/0238272 A1 | 10/2006 | Iwamoto et al. |
| 2008/0284540 A1 | 11/2008 | Nishihara et al. |
| 2009/0058555 A1 | 3/2009 | Takata et al. |
| 2010/0319975 A1 | 12/2010 | Tsutsumi et al. |
| 2011/0109400 A1 | 5/2011 | Koga et al. |

FOREIGN PATENT DOCUMENTS

| CN | 1852026 A | 10/2006 |
| CN | 101291156 A | 10/2008 |
| JP | 2002-76829 A | 3/2002 |
| JP | 2006-60747 A | 3/2006 |
| WO | 2007/145049 A1 | 12/2007 |
| WO | 2009/028683 A1 | 3/2009 |
| WO | 2009/104251 A1 | 8/2009 |

OTHER PUBLICATIONS

Chinese Office Action dated Jan. 6, 2014, in a counterpart Chinese patent application No. 201110350063.6.
Japanese Office Action dated Apr. 15, 2014, in a counterpart Japanese patent application No. 2010-252268.

*Primary Examiner* — Robert Pascal
*Assistant Examiner* — Kimberly Glenn
(74) *Attorney, Agent, or Firm* — Chen Yoshimura LLP

(57) ABSTRACT

In one aspect of the invention, a duplexer including a multi-layer substrate with multiple stacked layers and a back surface with a rectangular shape is disclosed. An antenna terminal, a transmission terminal, a reception terminal, a ground terminal, and a conductor are provided in various positions on the multilayer substrate for improved performance.

12 Claims, 28 Drawing Sheets

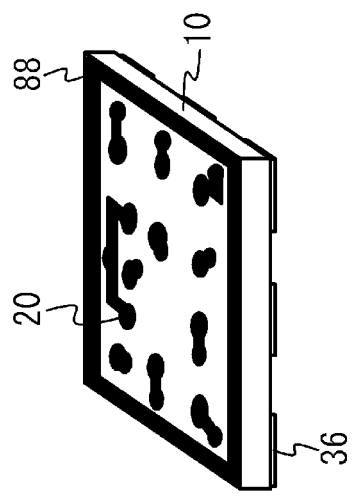
FIG. 11A
FIG. 11B
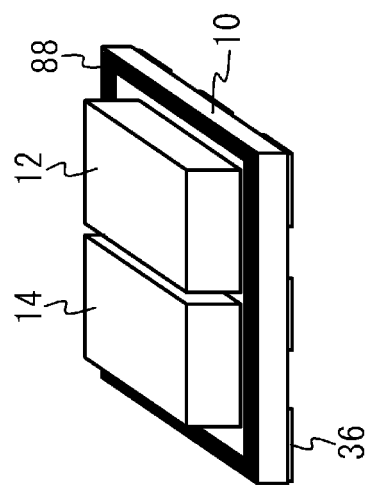
FIG. 11C
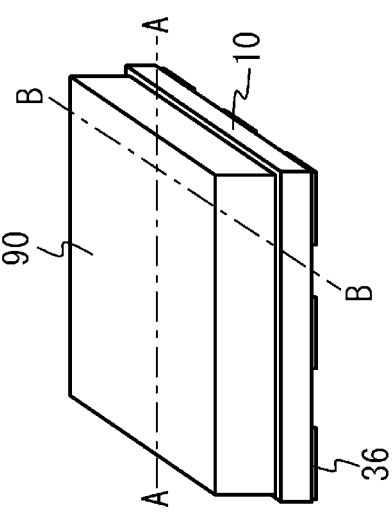
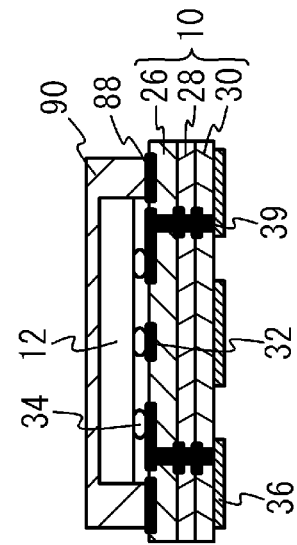
FIG. 11D
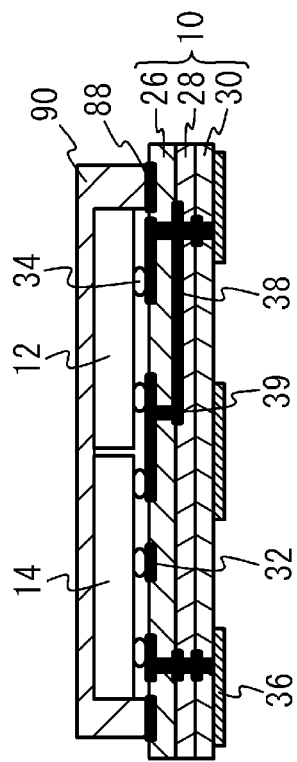
FIG. 11E

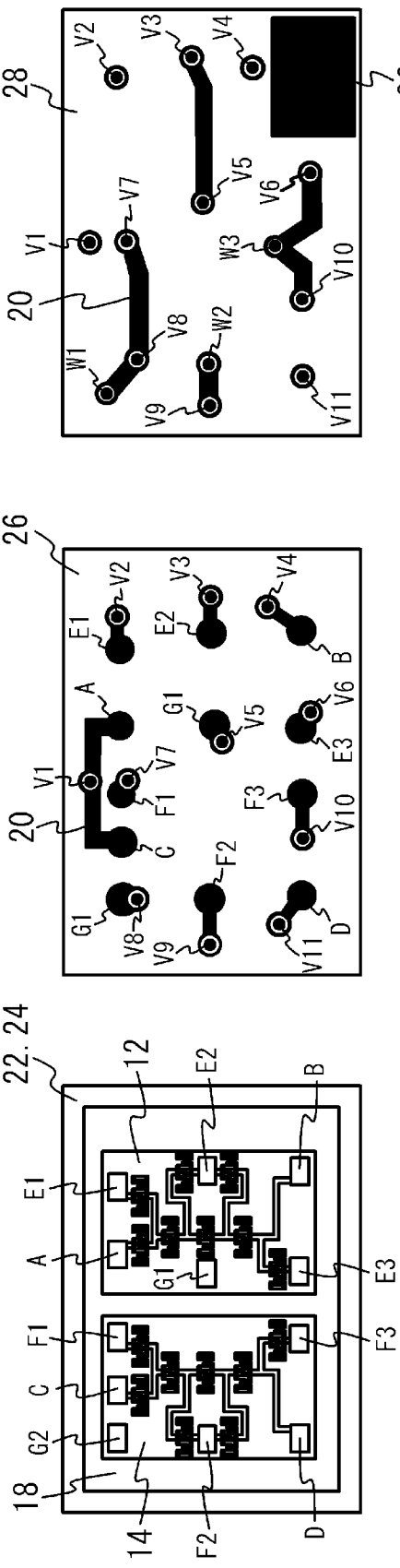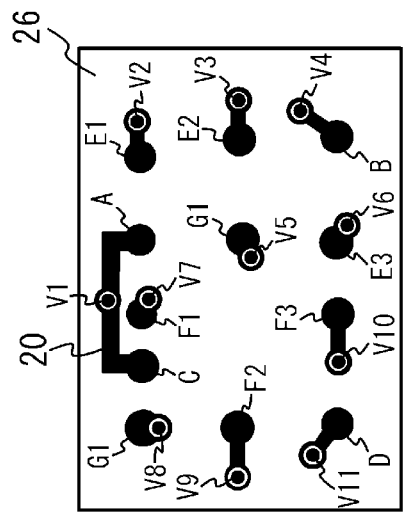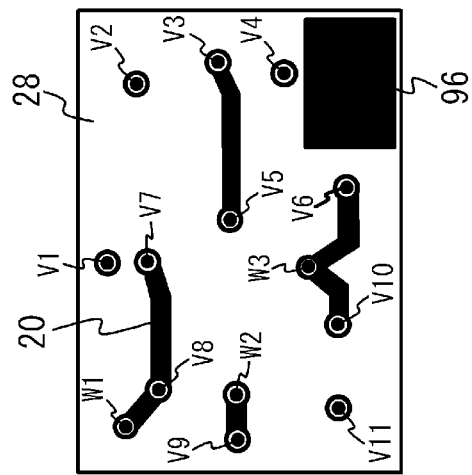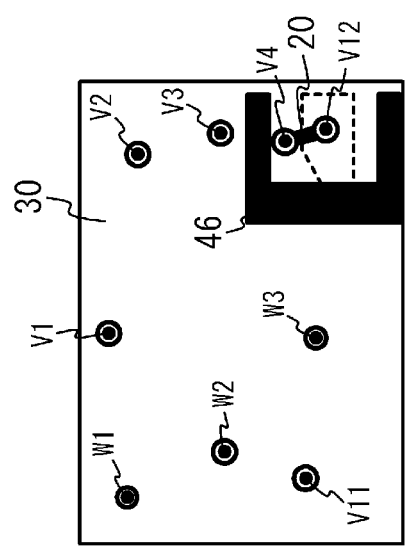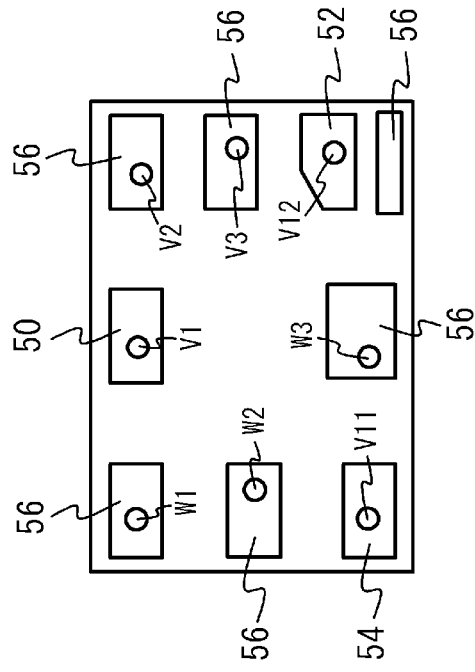

DUPLEXER AND ELECTRONIC DEVICE HAVING THE SAME

CROSS-REFERENCE TO RELATED APPLICATION

This application is based upon and claims the benefit of priority of the prior Japanese Patent Application No. 2010-252268, filed on Nov. 10, 2010, the entire contents of which are incorporated herein by reference.

FIELD

An aspect of the invention discussed herein is related to a duplexer and an electronic device having the same. Another aspect of the invention is related to a duplexer having a multilayer substrate having a plurality of layers stacked and an electronic device having such a duplexer.

BACKGROUND

Mobile communication device such as cellular phones and portable information terminal equipment are widely spread with the developments in the information-oriented society. For example, the cellular phones use RF bands as high as 800 MHz~1.0 GHz and 1.5 GHz~2.0 GHz. In order to cope with such RF bands, duplexers using acoustic waves such as acoustic wave resonators or piezoelectric thin-film resonators are used.

Japanese Patent Application Publication No. 2006-60747 (Document 1) discloses an art of using a shield electrode arranged between a transmission filter pattern and a reception filter pattern to improve the isolation between the patterns. Japanese Patent Application Publication No. 2002-76829 (Document 2) discloses an art of arranging external input terminals and external output terminals of a device having multiple filter elements so as to diagonally connect corners of the shape of the device in order to prevent signals from being interfered with each other.

Theoretically, an improvement in the isolation between the transmission and reception terminals of the duplexer may be achieved by designing the transmission filter to have an increased amount of attenuation at frequencies located in the passband of the reception filter and designing the reception filter to have an increased amount of attenuation at frequencies located in the passband of the transmission filter. However, actually, the isolation is affected by not only currents but also current that flow through a space due to electromagnetic coupling. Thus, the isolation is saturated at a certain level.

The influence of the electromagnetic coupling may be reduced by providing an electrode between the filters to realize electromagnetic shield structure as described in Document 1. Alternatively, the physical distance between the transmission and reception terminals may be increased, as described in Document 2. However, the arts disclosed in Documents 1 and 2 may not reduce the influence of the electromagnetic coupling considerably in the downsizing trend of RF communication devices.

SUMMARY OF THE INVENTION

According to an aspect of the present invention, there is provided a duplexer including: a multilayer substrate having multiple layers and having a back surface having a rectangular shape; an antenna terminal provided on the back surface so as to be close to a center of a first side of the back surface; a transmission terminal provided on the back surface so as to be close to a second side of the back surface crossing the first side and to be farther away from the antenna terminal than a center of the second side; a first reception terminal provided on the back surface so as to be close to a third side of the back surface opposite to the second side and to be farther away from the antenna terminal than a center of a third side; a first conductor provided on a first surface of a first layer out of the multiple layers so as to surround at least one of a first area defined by projecting the transmission terminal onto the first layer and a second area defined by projecting the first reception terminal thereon; and a ground terminal provided on a second surface of the first layer opposite to the first surface and located between the transmission terminal and a fourth side opposite to the first side and/or between the first reception terminal and the fourth side.

BRIEF DESCRIPTION OF THE DRAWINGS

FIG. 11A is a perspective view of a duplexer according to a second variation of the first embodiment, FIG. 11B is a perspective view of the duplexer from which a solder film has been removed, FIG. 11C is a perspective view of the duplexer from which the transmission and reception filters have been removed, FIG. 11D is a cross-sectional view taken along a line A-A in FIG. 11A, and FIG. 11E is a cross-sectional view taken along a line B-B in FIG. 11A;

FIG. 21A is a view of a cap mount layer and a cavity layer of a fifth embodiment, FIG. 21B is a plan view of a die attach layer of the fifth embodiment, FIG. 21C is a plan view of a line pattern layer, FIG. 21D is a plan view of a line pattern/foot pad layer, and FIG. 21E is a bottom view of the line pattern/foot pad layer;

DETAILED DESCRIPTION

Embodiments of the present invention are now described with reference to the accompanying drawings.

First Embodiment

Figure 1C:
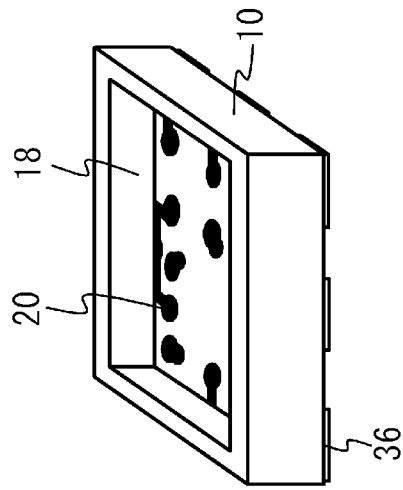
FIG. 1C is a perspective view of the duplexer from which a transmission filter and a reception filter have been removed.
Figure 1B:
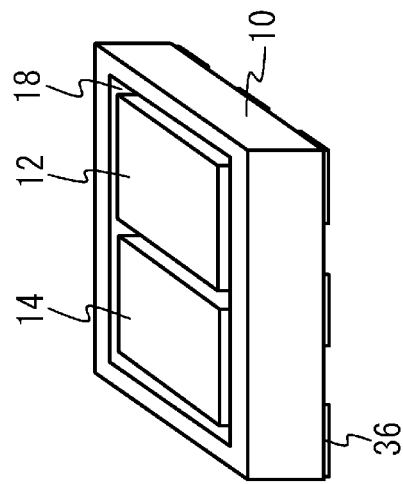
FIG. 1B is a perspective view of the duplexer from which a cap has been removed.
Figure 1A:
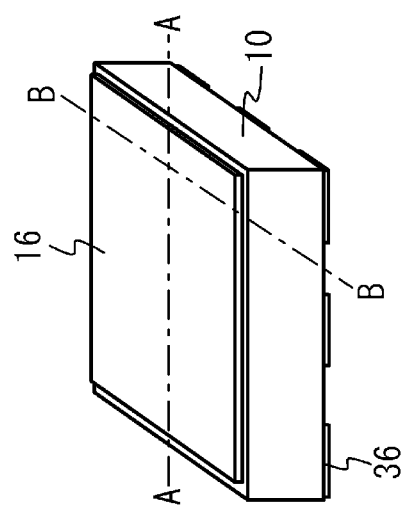
FIG. 1A is a perspective view of a duplexer according to a first embodiment.
Figure 1E:
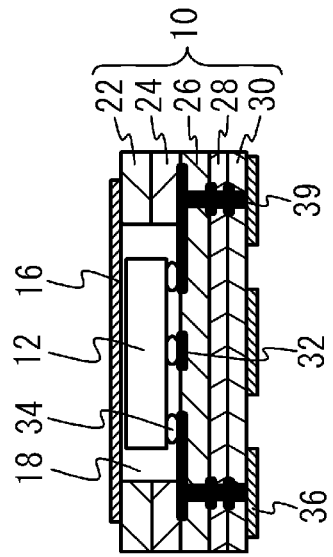
FIG. 1E is a cross-sectional view taken along a line B-B in FIG. 1A.
Figure 1D:
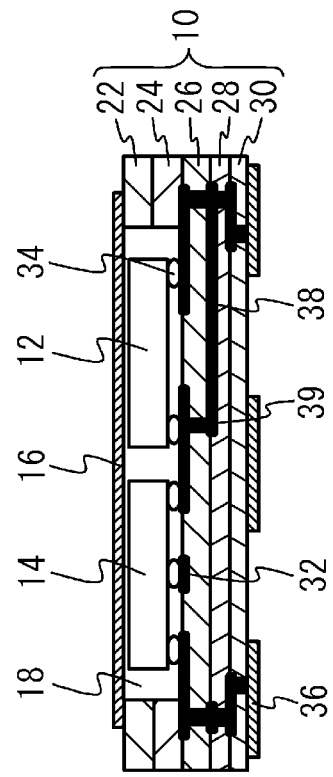
FIG. 1D is a cross-sectional view taken along a line A-A in FIG. 1A.

FIG. 1A is a perspective view of a duplexer in accordance with a first embodiment. FIG. 1B is a perspective view of the duplexer in FIG. 1A from which a cap has been removed. FIG. 1C is a perspective view of the duplexer in FIG. 1B from which a transmission filter and a reception filter have been removed. FIG. 1D is a cross-sectional view taken along a line A-A in FIG. 1A, and FIG. 1E is a cross-sectional view taken along a line B-B in FIG. 1A. As illustrated in FIGS. 1A through 1C, the duplexer of the first embodiment has a multilayer substrate 10 having a cavity 18, a transmission filter 12 and a reception filter 14 housed in the cavity 18, and a cap 16 made of a metal for sealing the transmission filter 12 and the reception filter 14 in the cavity 18. Foot pads 36 are provided on the lower surface of the multilayer substrate 10. A conductive pattern 20 including bump pads and interconnection lines are provided on the bottom plane of the cavity 18. The lower surface of the multilayer substrate 10 may be 2.5 mm×2.0 mm.

As illustrated in FIGS. 1D and 1E, the multilayer substrate 10 is formed by stacking a plurality of layers, which may be composed of a cap mount layer 22, a cavity layer 24, a die attach layer 26, a line pattern layer 28, and a line pattern/foot pad layer 30, for example. The cap mount layer 22 and the cavity layer 24 define the cavity 18 in which the transmission filter 12 and the reception filter 14 are housed. The cap 16 is attached to the upper surface of the cap mount layer 22 and seals the transmission filter 12 and the reception filter 14 in the cavity 18. Bump pads 32 are provided on the upper surface of the die attach layer 26. The transmission filter 12 and the reception filter 14 are mounted on the bump pads 32 by using bumps 34, which may be made of solder. The transmission filter 12 and the reception filter 14 are facedown mounted. Foot pads 36 are provided on the lower surface of the line pattern/foot pad layer 30. The foot pads 36 may be an antenna terminal, a transmission terminal, a reception terminal, and a ground terminal, for example. Each of the stacked layers may be formed by an insulator such as ceramic or resin. The line pattern 38 and vias 39, which may be made of an electrically conductive material, are used to electrically interconnect the transmission filter 12, the reception filter 14 and the foot pads 36.

Figure 2A:
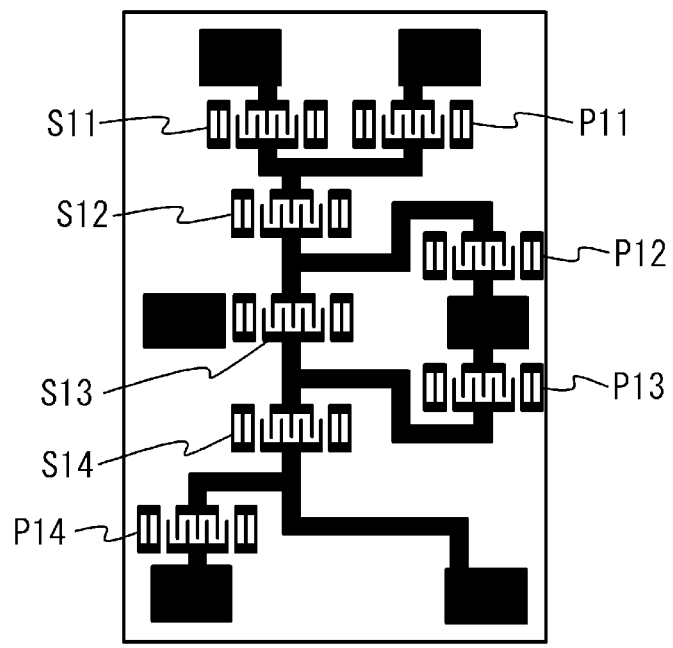
FIG. 2A is a plan view of the transmission filter or the reception filter.
Figure 2B:
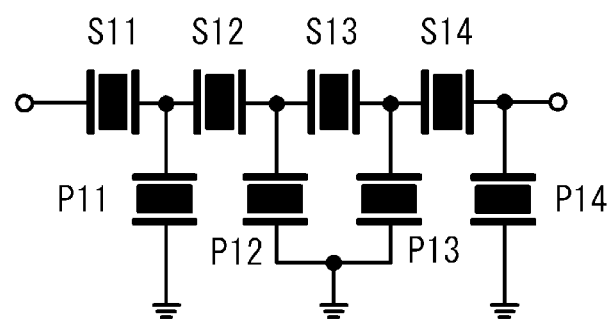
FIG. 2B is a circuit diagram of the filter.

The transmission filter 12 and the reception filter 14 are now described with reference to FIGS. 2A and 2B. FIG. 2A is a plan view of an exemplary structure of the transmission filter 12 and the reception filter 14, and FIG. 2B is a circuit diagram thereof. Referring to FIGS. 2A and 2B, each of the transmission filter 12 and the reception filter 14 is of ladder type, and is composed of series resonators S11~S14 and parallel resonators P11~P14. Each of those resonators may be a surface acoustic wave resonator, for example.

Figure 3A:
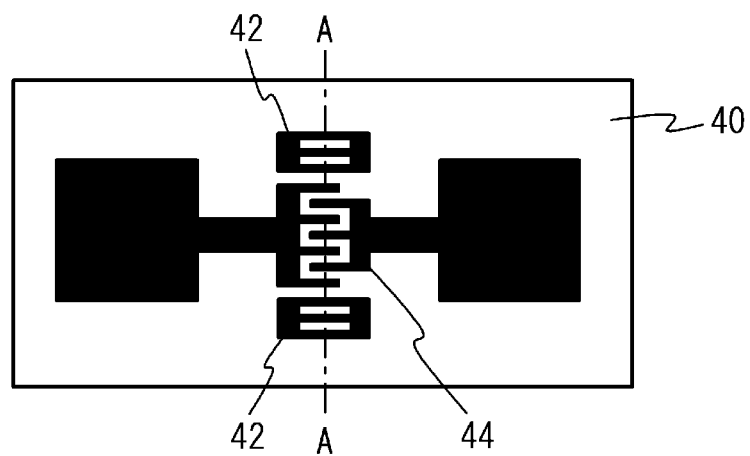
FIG. 3A is a plan view of an acoustic wave resonator.
Figure 3B:
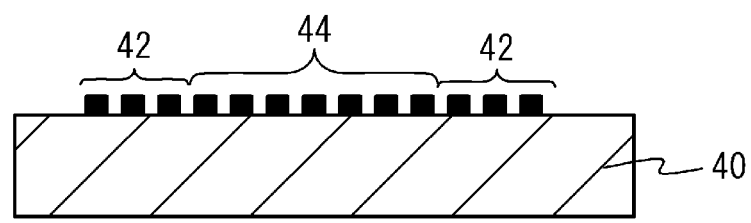
FIG. 3B is a cross-sectional view taken along a line A-A in FIG. 3A.

The surface acoustic wave resonator is now described in detail with reference to FIGS. 3A and 3B. FIG. 3A is a plan view of a surface acoustic wave resonator, and FIG. 3B is a cross-sectional view taken along a line A-A in FIG. 3A. Referring to FIGS. 3A and 3B, the surface acoustic wave resonator is composed of a piezoelectric substrate 40, a pair of reflection electrodes 42 formed thereon, and an interdigital transducer (IDT) 44 formed on the a piezoelectric substrate 40 and interposed between the pair of reflection electrodes 42. The IDT 44 has an input electrode and an output electrode, which face each other and electrode fingers thereof are interdigitated. The piezoelectric substrate 40 may be made of lithium tantalate (LT) or lithium niobate (LN), for example.

The layers of the multilayer substrate 10 are now described with reference to FIGS. 4A through 4E. As illustrated in FIG. 4A, a hole for forming the cavity 18 is formed in the cap mount layer 22 and the cavity layer 24. The transmission filter 12 and the reception filter 14 are housed in the cavity 18.

Figure 4B:
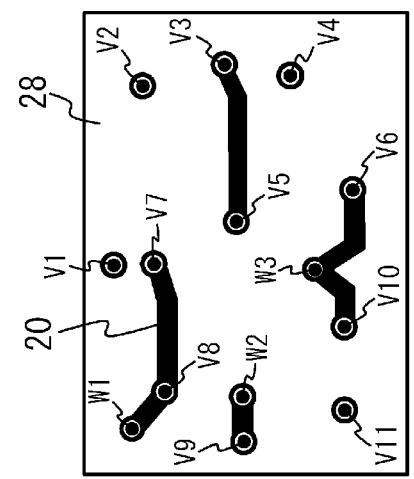
FIG. 4B is a plan view of a die attach layer of the first embodiment.

As illustrated in FIG. 4B, an electrically conductive pattern 20 made of an electrically conductive material such as a metal is formed on the upper surface of the die attach layer 26. The conductive pattern 20 includes bump pads (black circles in FIG. 4B), line lines (black lines), and vias (black double circles). The conductive pattern 20 has a thickness of, for example, 15 μm. The conductive pattern 20 may be made of an alloy of aluminum (Al) and copper (Cu). The conductive pattern 20 may be made of another alloy including Al as a main component such as Al—Mg or may be a multilayer film including metals or another multilayer film including a metal and an alloy. Examples of the multilayer film are Al—Cu/Cu/Al—Cu, Al/Cu/Al, Al/Mg/Al, Al—Mg/Mg/Al—Mg. Pads A~G2 of the transmission filter 12 and the reception filter 14 illustrated in FIG. 4A are connected to bump pads A~G2 on the upper surface of the die attach layer 26. Pads A and C are electrically connected to an antenna terminal 50 on the lower surface of the line pattern/foot pad layer 30. Pad B is electrically connected to a transmission terminal 52 on the lower side of the layer 30, and pad D is electrically connected to a first reception terminal 54 thereon. Pads E1~E3, F1~F3 and G1~G2 are connected to ground terminals 56 on the lower surface of the layer 30. Vias pass through the die attach layer 26 and are full of an alloy of Al and Cu, for example. The vias electrically connect the conductive pattern 20 formed on the upper surface of the die attach layer 26 and the conductive pattern formed on the upper surface of the line pattern layer 28 together. Vias V1~V11 that appear on the upper surface of the die attach layer 26 are connected to vias V1~V11 that appear on the upper surface of the line pattern layer 28. The line pattern includes lines for connecting the bump pads and the vias together.

Figure 4C:
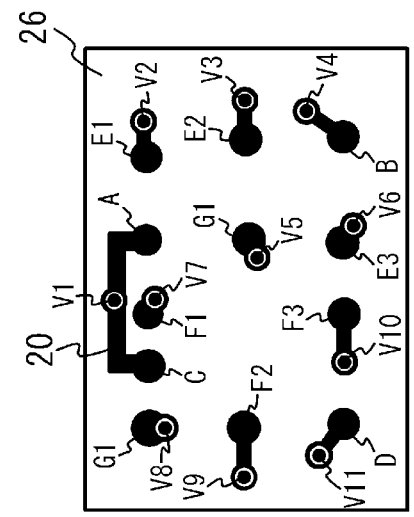
FIG. 4C is a plan view of a line pattern layer of the first embodiment.
Figure 4A:
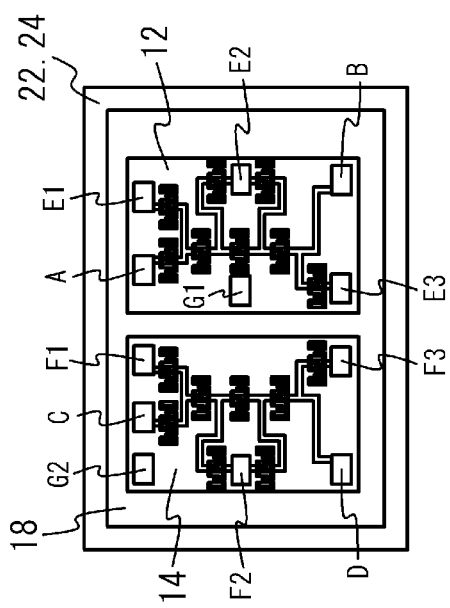
FIG. 4A is a view of a cap mount layer and a cavity layer of a first embodiment.

As illustrated in FIG. 4C, a conductive pattern 20 including lines and vias is formed on the upper surface of the line pattern layer 28. The lines connect the vias. The vias that pass through the line pattern layer 28 electrically interconnect the conductive pattern form on the upper surface of the line pattern layer 28 and the conductive pattern 20 formed on the upper surface of the line pattern/foot pad layer 30. Vias V1~V4, V11 and W1~W3 that appear on the upper surface of the line pattern layer 28 are connected to vias V1~V4, V11 and W1~W3 that appear on the upper surface of the line pattern/foot pad layer 30.

Figure 4E:
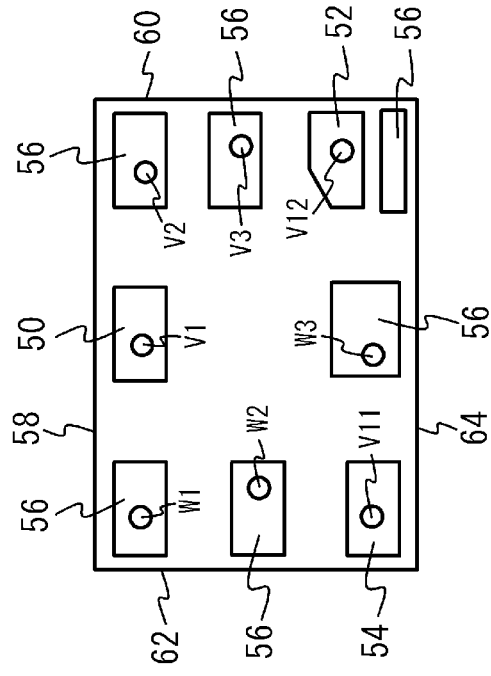
FIG. 4E is a bottom view of the line pattern/foot pad layer.
Figure 4D:
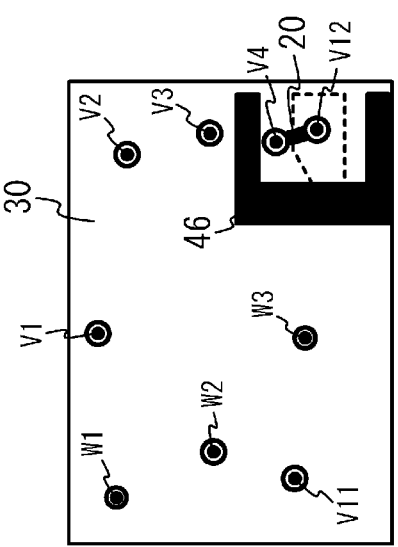
FIG. 4D is a plan view of a line pattern/foot pad layer of the first embodiment.

As illustrated in FIG. 4D, a conductive pattern 20 including a line and vias is formed on the upper surface of the line pattern/foot pad layer 30. A first conductor 46 is provided so as to surround an area virtually formed by projecting the transmission terminal 52 provided on the lower surface of the line pattern/foot pad layer 30 on the upper surface thereof (an area illustrated by a broken line in FIG. 4D). The first conductor 46 may be made of the same material as that of the conductive pattern 20 and may be an alloy of Al and Cu, for example. The first conductor 46 may have the same thickness as that of the conductive pattern 20 and is, for example, 15 μm. The first conductor 46 is not connected to the other conductive patterns 20 and is a floating conductor. The vias that pass through the line pattern/foot pad layer 30 electrically interconnect the conductive pattern 20 formed on the upper surface of the layer 30 and the foot pads 56 formed on the lower surface thereof. Vias V1~V3, V11, V12 and W1~W3 that appear on the upper surface of the layer 30 are connected to vias V1~V3, V11, V12 and W1~W3 that appear on the lower surface thereof.

As illustrated in FIG. 4E, the foot pads 56, which may be made of a conductor such as cupper plated with gold, are provided on the lower surface of the line pattern/foot pad layer 30. The foot pads 56 include the antenna terminal 50, the transmission terminal 52, the first reception terminal 54 and the ground terminals 56. The antenna terminal 50 is provided in the vicinity of the center of a first side 58, which is one of two long sides of a rectangular lower surface of the line pattern/foot pad layer 30. The transmission terminal 52 is provided close to a second side 60 of the rectangular lower surface orthogonal to the first side 58 and is closer to a fourth side 64 than the first side 58. The fourth side 64 is opposite to the first side 58. The first reception terminal 54 is provided close to a third side 62 opposite to the second side 60 and is located in the vicinity of a corner defined by the third side 62 and the fourth side 64. In FIG. 4E, six ground pads 56 are illustrated. A first one of the six pads 56 is provided in the vicinity of the center of the second side 60. A second one of the pads 56 is provided in the vicinity of the center of the third side 62. A third one of the pads 56 is provided in the vicinity of the center of the fourth side 64. A fourth one of the pads 56 is provided in the vicinity of a corner defined by the first side 58 and the second side 60. A fifth one of the pads 56 is provided in the vicinity of a corner defined by the first side 58 and the third side 62. A sixth one of the pads 56 is provided in the vicinity of a corner defined by the second side 60 and the fourth side 64.

Figure 5A:
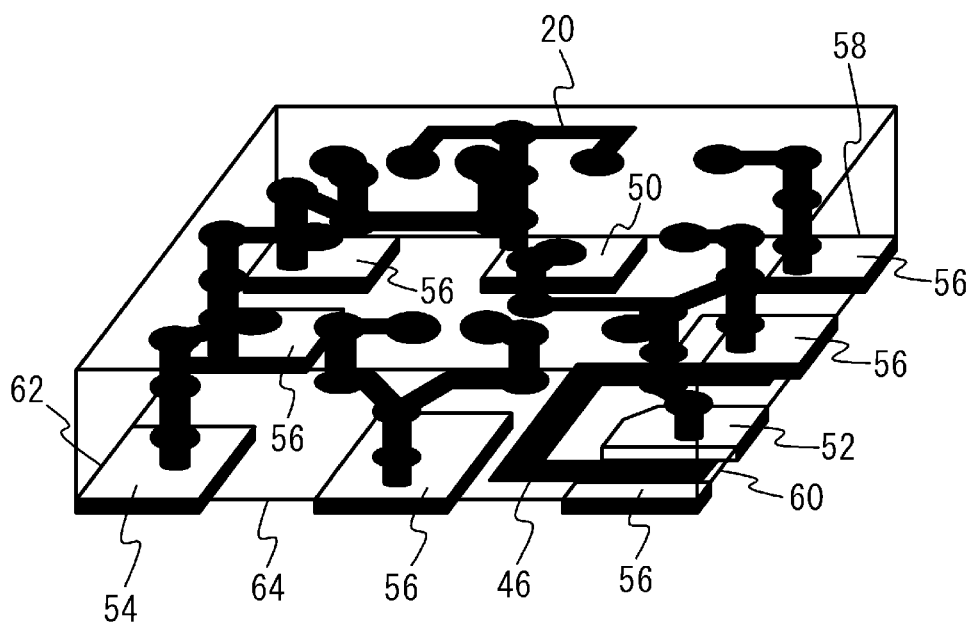
FIG. 5A is a perspective view of the duplexer of the first embodiment.

FIG. 5A is a perspective view of the first embodiment, which is seen through structural components other than the conductive pattern 20, the foot pads 56 and the first conductor 46 (this holds true for FIGS. 15A, 17A, 20A and 27A). As illustrated in FIG. 5A, the transmission terminal 52 is surrounded by the three ground terminals 56 among the six ground terminals, namely, the above-described first, third and sixth ground pads 56. That is, the ground terminals 56 are provided in a direction along the fourth side 64 and in another direction along the second side 60. The two directions are orthogonal to each other. On the lower surface of the multilayer substrate 10, the transmission terminal 52 is electromagnetically shielded with the ground terminals 56 in the two directions, that is, the direction towards the first reception terminal 54 from the transmission terminal 52 and the direction orthogonal thereto.

The first conductor 46 is provided to the upper surface of the line pattern/foot pad layer 30 included in the multilayer substrate 10 so as to surround the area onto which the transmission terminal 52 is projected. The first conductor 46 is arranged around the area onto which the transmission terminal 52 is projected is composed of two portions extending in the direction along the fourth side 64 and a portion extending in the direction orthogonal thereto and connecting the two portions. Thus, the transmission terminal 52 is electromagnetically shielded with the ground terminals 56 in the two directions, that is, the direction towards the first reception terminal 54 from the transmission terminal 52 and the direction orthogonal thereto.

Figure 5B:
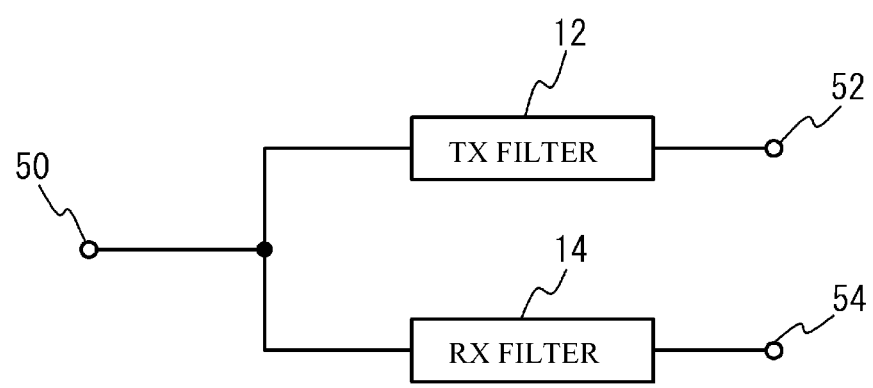
FIG. 5B is a circuit diagram of the duplexer.

FIG. 5B is a circuit diagram of the duplexer of the first embodiment. Referring to FIG. 5B, the transmission filter 12 is connected between the antenna terminal 50 and the transmission terminal 52. The reception filter 14 is connected between the antenna terminal 50 and the first reception terminal 54. The transmission filter 12 is connected between the antenna terminal 50 and the transmission terminal 52 via the conductive patterns 20 illustrated in FIGS. 4A through 4E. Similarly, the reception filter 14 is connected between the antenna terminal 50 and the first reception terminal 54 via the conductive patterns 20 illustrated in FIGS. 4A through 4E.

Figure 6C:
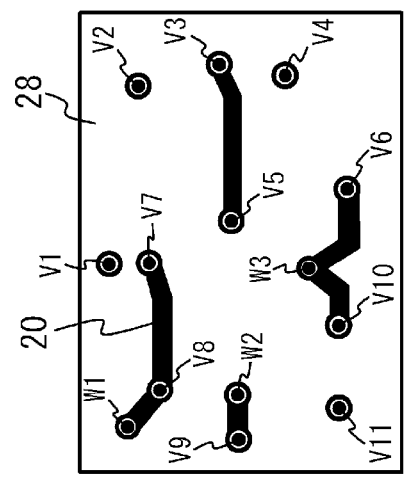
FIG. 6C is a plan view of a line pattern layer of the first comparative example.
Figure 6B:
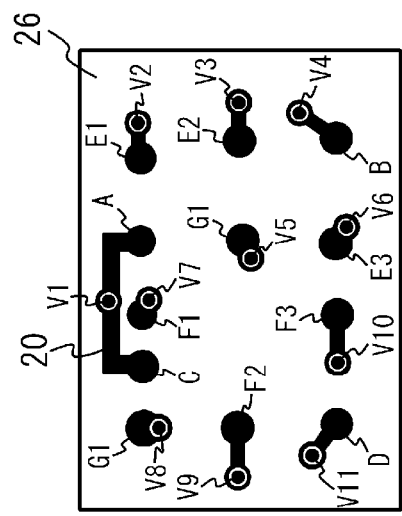
FIG. 6B is a plan view of a die attach layer of the first comparative example.
Figure 6A:
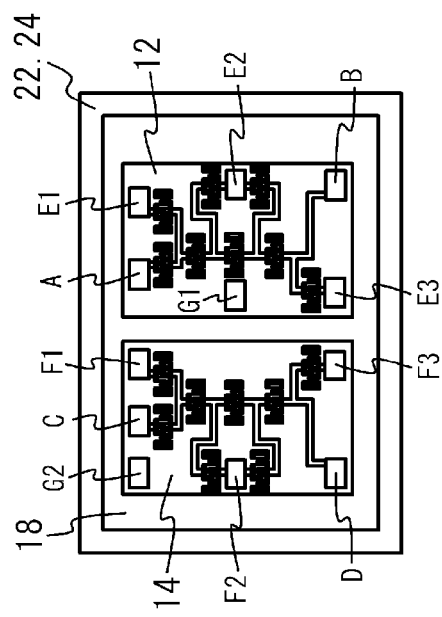
FIG. 6A is a cap mount layer and a cavity layer of a first comparative example.
Figure 6E:
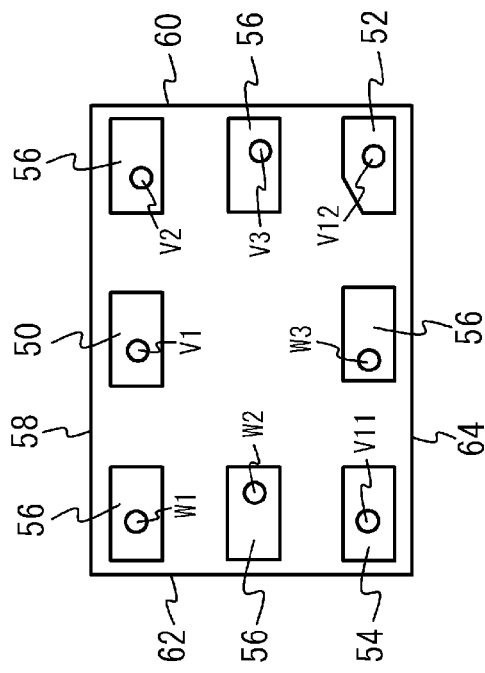
FIG. 6E is a bottom view of the line pattern/foot pad layer.
Figure 6D:
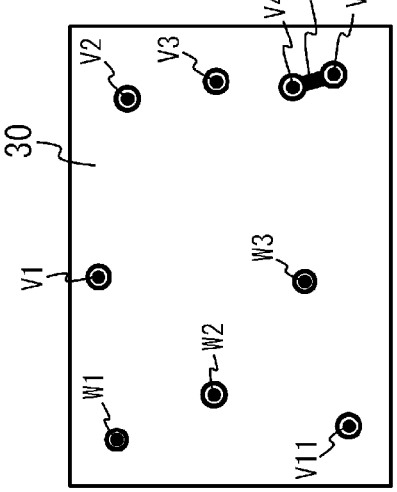
FIG. 6D is a plan view of a line pattern/foot pad layer of the first comparative example.

A description is now given of a first comparative example, which is to be compared with the duplexer of the first embodiment in order to describe effects of the first embodiment. A duplexer configured according to the first comparative example differs from the duplexer of the first embodiment only in the pattern formed on the line pattern/foot pad layer 30 of the multilayer substrate 10. Except the above pattern, the duplexer of the first comparative example is the same as that of the first embodiment already described with reference to FIG. 1A through FIG. 3B. FIGS. 6A through 6E illustrate layers of the multilayer substrate 10 employed in the duplexer of the first comparative example. As illustrated in FIG. 6D, the first conductor 46 is not provided on the upper surface of the line pattern/foot pad layer 30. As illustrated in FIG. 6E, the ground terminal 56 is not provided between the transmission terminal 52 and the fourth side 64 on the lower surface of the line pattern/foot pad layer 30. The transmission terminal 52 is provided in the vicinity of the corner formed by the second side 60 and the fourth side 64. The other parts of the first comparative example are the same as those of the first embodiment previously described with reference to FIGS. 4A through 4E.

Figure 7A:
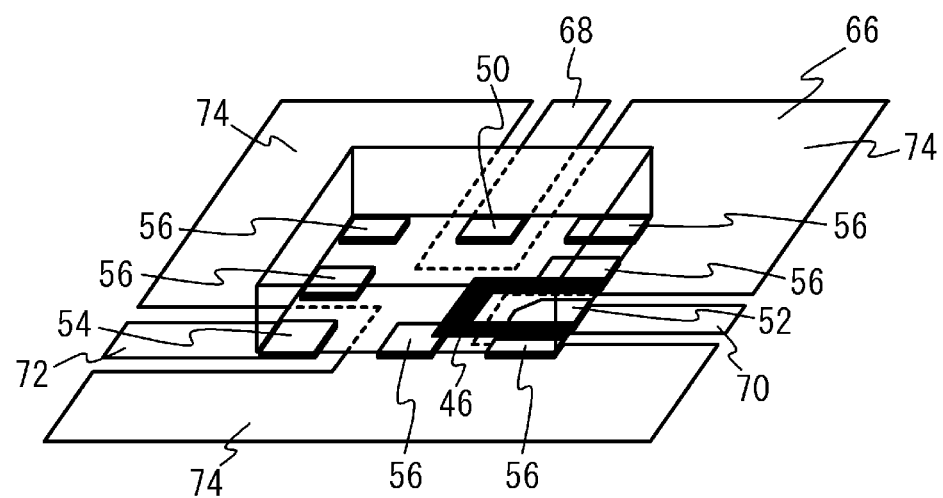
FIG. 7A is a perspective view of an electronic device in which the duplexer of the first embodiment is mounted on a printed-circuit board.
Figure 7B:
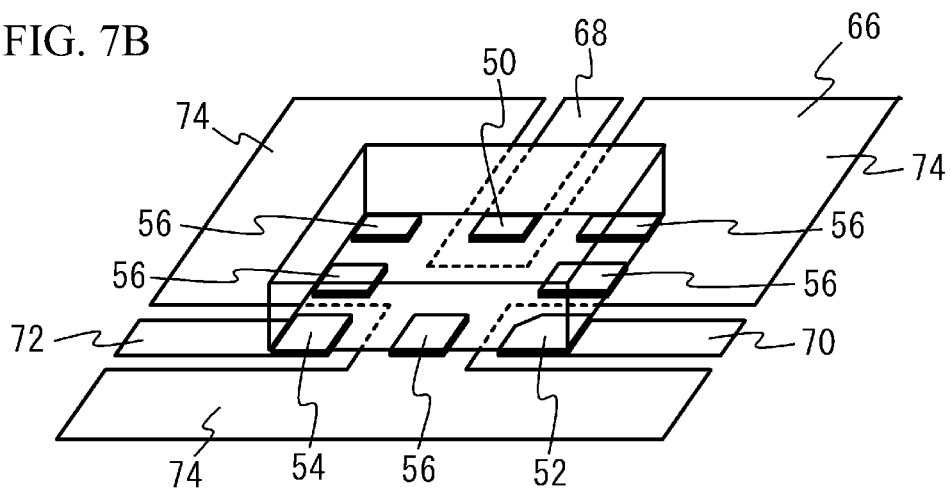
FIG. 7B is a perspective view of an electronic device in which the duplexer of the first comparative example is mounted on a printed-circuit board.

FIG. 7A is a perspective view of an electronic device in which the duplexer of the first embodiment is mounted on a printed-circuit board, and FIG. 7B is a perspective view of an electronic device in which the duplexer of the first comparative example is mounted on a printed-circuit board. In FIGS. 7A and 7B, the duplexers are seen through the structural parts other than the foot pads 36 and the first conductor 46 (this holds true for FIGS. 15B, 17B, 20B and 27B). The electronic device may be a portable information terminal or a mobile communication device, for example. As illustrated in FIGS. 7A and 7B, a printed-circuit board 66 has an antenna signal line 68, a transmission signal line 70, a reception signal line 72, and a ground line 74. The antenna terminal provided to the lower surface of the multilayer substrate 10 is connected to the antenna signal line 68 of the printed-circuit board 66 by solder, for example. Similarly, the transmission terminal 52, the first reception terminal 54 and the ground terminals 56 are respectively connected to the transmission signal line 70, the reception signal line 72 and the ground line 74 by solder, for example. The heights of the antenna terminal 50, the transmission terminal 52, the first reception terminal 54 and the ground terminals 56 may be 30 μm, for example. The above heights correspond to the distance between the printed-circuit board 66 and the lower surface of the multilayer substrate 10. The ground line 74 is provided so as to surround peripheries of the antenna signal line 68, the transmission signal line 70 and the reception signal line 72.

The duplexer of the first embodiment differs from that of the first comparative example in that the ground terminal 56 is additionally provided between the transmission terminal 52 and the fourth side 64 and the first conductor 46 is provided so as to surround the area virtually formed by projecting the transmission terminal 52. Thus, the transmission terminal 52 of the electronic device with the duplexer of the first embodiment is integrally surrounded by the ground terminals 56, the first conductor 46 and the ground line 74.

Figure 8A:
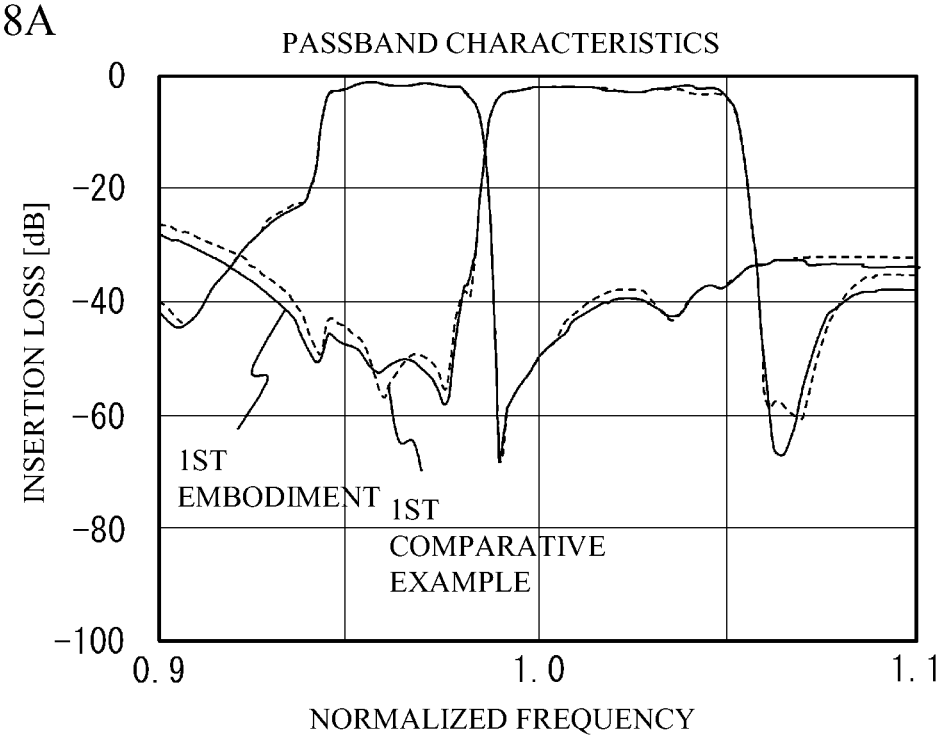
FIG. 8A illustrates simulation results of passband characteristics of transmission and reception filters.
Figure 8B:
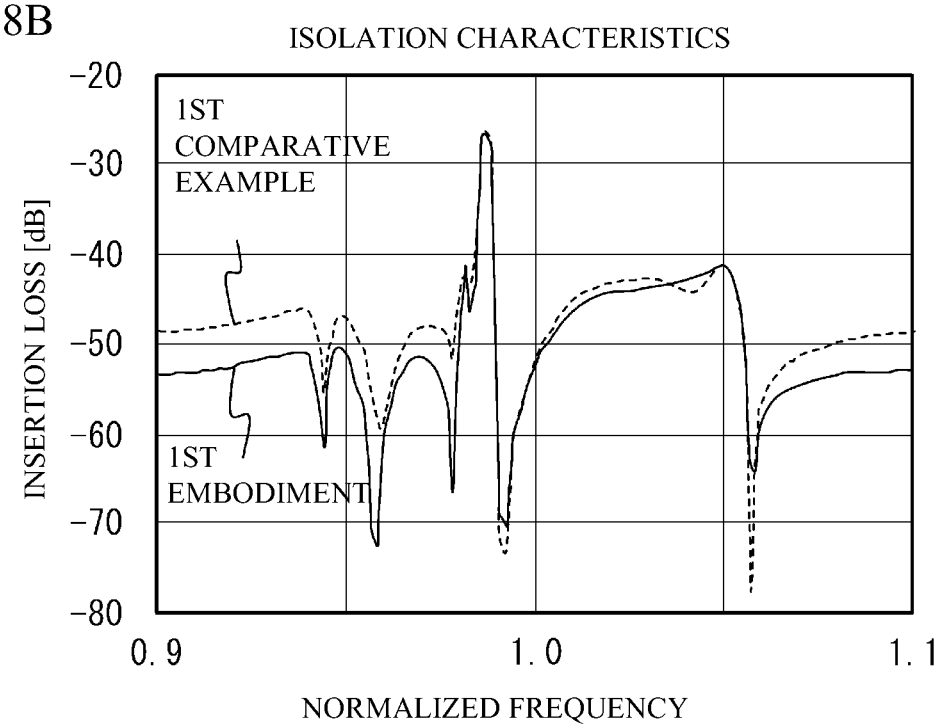
FIG. 8B illustrates simulation results of an isolation characteristic between a transmission terminal and a reception terminal.

The inventors simulated the electronic devices illustrated in FIGS. 7A and 7B, and measured the passband characteristics of the transmission filter 12 and the reception filter 14, and the isolation characteristic between the transmission terminal 52 and the first reception terminal 54 in each of the electronic devices. FIG. 8A illustrates the simulation results of the passband characteristics between the transmission filter 12 and the reception filter 14 in each of the electronic devices, and FIG. 8B illustrates the simulation results of the isolation characteristic between the transmission terminal 52 and the first reception terminal 54 in each of the electronic devices. In FIGS. 8A and 8B, the horizontal axis denotes the normalized frequency, and the vertical axis denotes the insertion loss. The simulation results of the first embodiment are illustrated by solid lines, and those of the first comparative example are illustrated by broken lines.

As illustrated in FIG. 8A, there is little difference in the passband characteristic of the duplexer between the first embodiment and the first comparative example. As illustrated in FIG. 8B, the isolation characteristic of the first embodiment is improved by about 10 dB in the transmission band and outside of the passbands, as compared with the first comparative example. The reason why the isolation characteristic of the first embodiment is improved is that the transmission terminal 52 is three-dimensionally shielded by additionally providing the first conductor 46 surrounding the area virtually formed by projecting the transmission terminal 52 and the ground terminal 56 between the transmission terminal 52 and the fourth side 64.

As described above, according to the first embodiment, the first conductor 46 is provided on the upper surface of the line pattern/foot pad layer 30 so as to surround the area virtually formed by projecting the transmission terminal 52 thereon, as illustrated in FIG. 4D. Further, as illustrated in FIG. 4E, the ground terminal 56 is provided between the transmission terminal 52 and the fourth side 64 on the lower surface of the multilayer substrate 10 (that is, the lower surface of the line pattern/foot pad layer 30) in addition to the ground terminal 56 provided in the vicinity of the center of the second side 60 and the ground terminal provided in the vicinity of the center of the fourth side 64. Thus, on the lower surface of the multilayer substrate 10 and the upper surface of the line pattern/foot pad layer 30, the transmission terminal 52 is electromagnetically shielded in both the direction towards the first reception terminal 54 and the direction orthogonal thereto. It is thus possible to block the electromagnetic wave propagating towards the first reception terminal 54 from the transmission terminal 52 and that in the direction orthogonal thereto. It is to be noted that the electromagnetic wave particularly tends to be radiated towards the side of the transmission signal line 70 of the printed-circuit board 66. Thus, the electromagnetic wave can be blocked by the ground terminal 56 provided between the transmission terminal 52 and the fourth side 64 in addition to the ground terminal 56 provided in the vicinity of the center of the second side 60. It is thus possible to reduce the electromagnetic coupling between the transmission terminal 52 and the first reception terminal 54 and to improve the isolation characteristic as illustrated in FIG. 8B.

As illustrated in FIG. 4E, the antenna terminal 50 is provided in the vicinity of the center of the first side 58, which is one of the four sides of the lower surface of the multilayer substrate 10 having a rectangular shape. The transmission terminal 52 is provided in the vicinity of the second side 60 so as to be farther away from the antenna terminal 50 than the center of the second side 60. The first reception terminal 54 is provided in the vicinity of the third side 62 so as to be farther away from the antenna terminal 50 than the center of the third side 62. It is thus possible to increase the physical distances between the antenna terminal 50, the transmission terminal 52 and the first reception terminal 54 and to reduce the electromagnetic couplings between these terminals more effectively. The lower surface (back surface) of the multilayer substrate 10 may be not limited to the rectangular shape but may be shaped into a square.

In the above-described first embodiment, the first conductor 46 surrounds the area virtually formed by projecting the transmission terminal 52, and the ground terminal 56 is provided between the transmission terminal 52 and the fourth side 64. However, the first embodiment is not limited to the above but may have another arrangement. The first conductor 46 may be provided so as to surround an area virtually formed by projecting the first reception terminal 54, and the ground terminal 56 may be provided between the first reception terminal 54 and the fourth side 64. That is, the first conductor 46 may be provided so as to surround the area virtually formed by projecting the transmission terminal 52 or the first reception terminal 54, and the ground terminal 56 may be located below the first conductor 46 and may be interposed between the transmission terminal 52 and the fourth side 64 or between the first reception terminal 54 and the fourth side 64. It is thus possible to reduce the electromagnetic coupling between the transmission terminal 52 and the first reception terminal 54 and improve the isolation characteristic. When downsizing of the duplexer is considered, it is preferable that the ground terminal 56 is provided between the transmission terminal 52 and the fourth side 64 or between the first reception terminal 54 and the fourth side 64 and is located just below the first conductor 46.

In order to block the electromagnetic wave radiated via the transmission terminal 52, it is preferable that the first conductor 46 surrounds the area virtually formed by projecting the transmission terminal 52 in the direction towards the first reception terminal 54 and the direction orthogonal thereto. However, even when the first conductor 46 partly surrounds the area virtually formed by projecting the transmission terminal 52, the electromagnetic wave from the transmission terminal 52 may be blocked.

The first conductor 46 is not limited to the floating conductor but may be grounded. That is, the first conductor 46 is not connected to the signal line connected to any of the antenna terminal 50, the transmission terminal 52 and the first reception terminal 54. In order to improve the effect of shielding the transmission terminal 52, it is preferable that the ground terminal 56 provided between the transmission terminal 52 and the fourth side 64 and the ground terminal 56 provided in the vicinity of the center of the second side 60 extend beyond the transmission terminal 52 in the direction in which the fourth side 64 extends. That is, it is preferable that the whole side of the transmission terminal 52 is surrounded by the ground terminal 56. However, even when at least a part of the side of the transmission terminal 52 is surrounded by the ground terminal 56, the electromagnetic wave may be blocked.

Figure 9A:
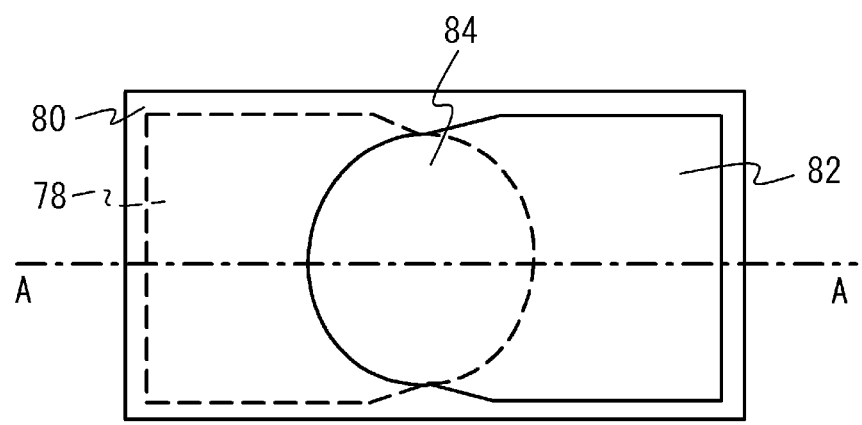
FIG. 9A is a plan view of a piezoelectric thin-film resonator.
Figure 9B:
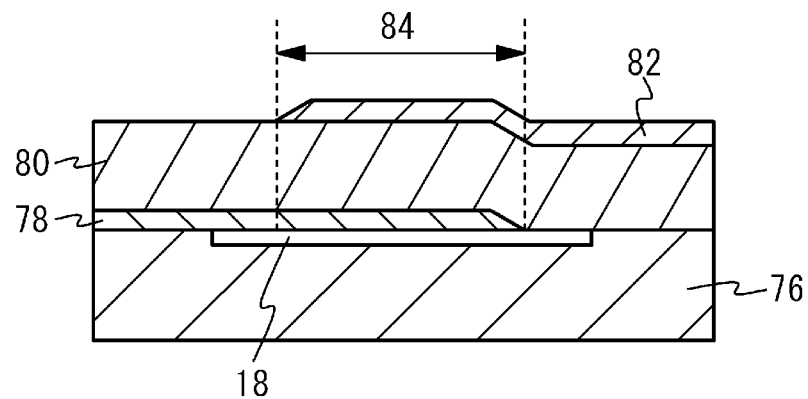
FIG. 9B is a cross-sectional view taken along a line A-A in FIG. 9A.

The transmission filter 12 and the reception filter 14 of the first embodiment are not limited to the ladder type filters but may be of another type and may be a multi-mode filter. The resonators that form the ladder type filter are not limited to the surface acoustic wave resonators but may be acoustic wave resonators such as piezoelectric thin-film resonators or boundary acoustic wave filters. Yet another type of filter may be employed. It is particularly preferable to use resonators suitable for RF communications. Now, the piezoelectric thin-film resonator is described with reference FIGS. 9A and 9B. FIG. 9A is a plan view of a piezoelectric thin-film resonator, and FIG. 9B is a cross-sectional view taken along a line A-A in FIG. 9A. Referring to FIGS. 9A and 9B, the piezoelectric thin-film resonator has a lower electrode 78, a piezoelectric film 80 and an upper electrode 82, which are stacked in this order on a substrate 76. A resonator part 84 is formed by portions of the lower electrode 78 and the upper electrode 82 that face each other through the piezoelectric film 80. A cavity 18 is formed on the substrate 76 below the lower electrode 78 so as to include the resonator part 84 horizontally.

In the first embodiment, as illustrated in FIGS. 1A through 1E, the transmission filter 12 and the reception filter 14 are arranged in the cavity 18 of the multilayer substrate 10, and are enclosed in the cavity 18 by the cap 16. However, the first embodiment is not limited to the above arrangement. For example, the first embodiment has a first variation illustrated in FIGS. 10A through 10E, a second variation illustrated in FIGS. 11A through 11E, a third variation illustrated in FIGS. 12A through 12E, and may have a further variation. The first through third variations are now described.

Figure 10C:
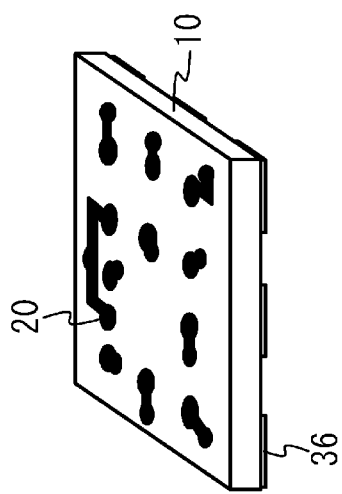
FIG. 10C is a perspective view of the duplexer from which the transmission and reception filters have been removed.
Figure 10B:
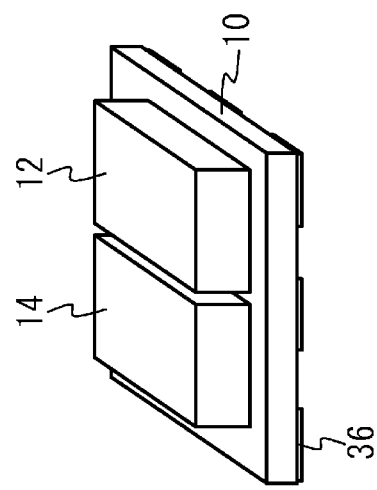
FIG. 10B is a perspective view of the duplexer from which resin has been removed.
Figure 10E:
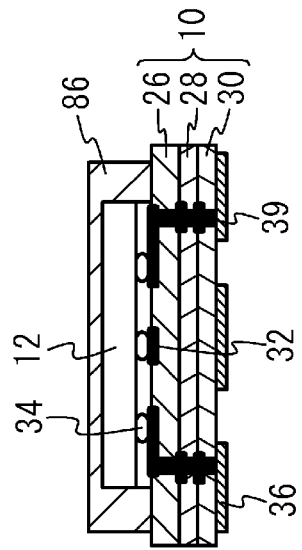
FIG. 10E is a cross-sectional view taken along a line B-B in FIG. 10A.
Figure 10A:
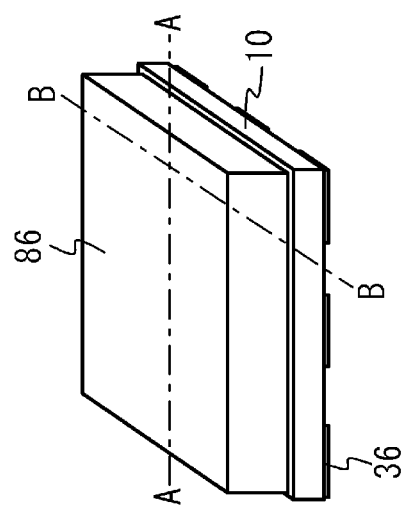
FIG. 10A is a perspective view of a duplexer according to a first variation of the first embodiment.
Figure 10D:
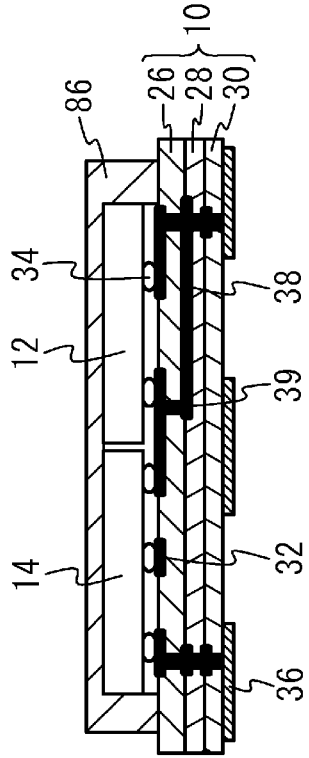
FIG. 10D is a cross-sectional view taken along a line A-A in FIG. 10A.

FIGS. 10A through 10C are perspective views of the first variation of the first embodiment, FIG. 10D is a cross-sectional view taken along a line A-A illustrated in FIG. 10A, and FIG. 10E is a cross-sectional view taken along a line B-B in FIG. 10A. Referring to FIGS. 10A through 10E, the multilayer substrate 10 is composed of the die attach layer 26, the line pattern layer 28 and the line pattern/foot pad layer 30. The cavity 18 is not formed in the multilayer substrate 10. The transmission filter 12 and the reception filter 14 are mounted on the upper surface of the die attach layer 26, and are sealed with resin 86 by transfer molding. The other structures of the first variation are the same as those of the first embodiment.

FIGS. 11A through 11C are perspective views of the second variation of the first embodiment, FIG. 11D is a cross-sectional view taken along a line A-A illustrated in FIG. 11A, and FIG. 11E is a cross-sectional view taken along a line B-B in FIG. 11A. Referring to FIGS. 11A through 11E, the multilayer substrate 10 is composed of the die attach layer 26, the line pattern layer 28 and the line pattern/foot pad layer 30. The cavity 18 is not formed in the multilayer substrate 10. The transmission filter 12 and the reception filter 14 are mounted on the upper surface of the die attach layer 26. A seal ring 88 made of a metal or the like is provided on peripheral portions on the upper surface of the die attach layer 26 so as to surround the transmission filter 12 and the reception filter 14. A solder film 90 is connected to the seal ring 88 and is formed to enclose the transmission filter 12 and the reception filter 14. The transmission filter 12 and the reception filter 14 are hermetically sealed with the solder film 90 that contacts the seal ring 88. The other structures of the second variation are the same as those of the first embodiment illustrated in FIGS. 1A through 1E.

Figure 12A:
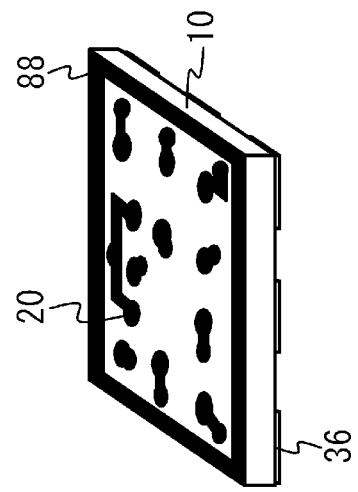
FIG. 12A is a perspective view of a duplexer according to a third variation of the first embodiment.
Figure 12B:
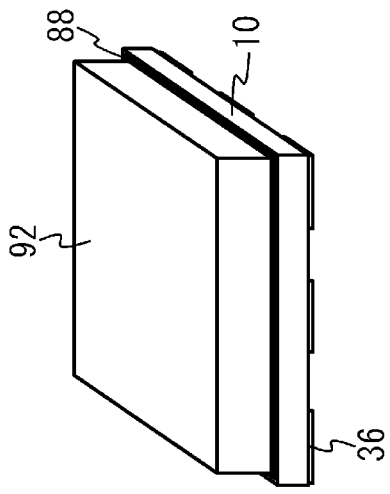
FIG. 12B is a perspective view of the duplexer from which resin has been removed.
Figure 12C:
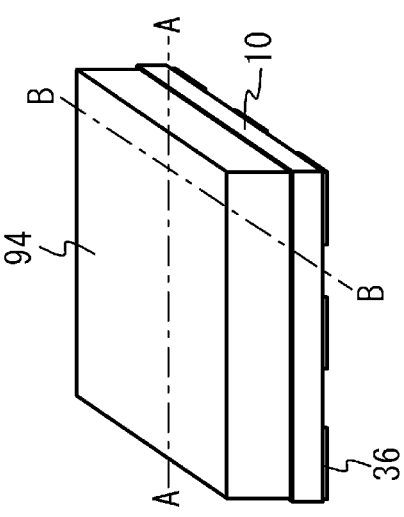
FIG. 12C is a perspective view of the duplexer from which a filter chip has been removed.
Figure 12D:
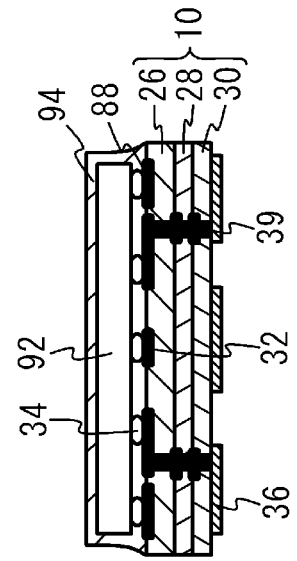
FIG. 12D is a cross-sectional view taken along a line A-A in FIG. 12A.
Figure 12E:
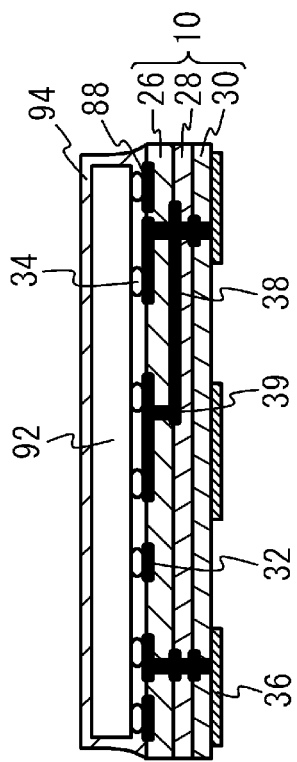
FIG. 12E is a cross-sectional view taken along a line B-B in FIG. 12A.

FIGS. 12A through 12C are perspective views of the third variation of the first embodiment, FIG. 12D is a cross-sectional view taken along a line A-A illustrated in FIG. 12A, and FIG. 12E is a cross-sectional view taken along a line B-B in FIG. 12A. Referring to FIGS. 12A through 12E, the multilayer substrate 10 is composed of the die attach layer 26, the line pattern layer 28 and the line pattern/foot pad layer 30. The cavity 18 is not formed in the multilayer substrate 10. A filter chip 92 on which the transmission filter 12 and the reception filter 14 are formed is mounted on the upper surface of the die attach layer 26. The seal ring 88 is provided on the peripheral portions on the upper surface of the die attach layer 26 so as to surround the filter chip 92. The filter chip 92 is sealed with resin 94 by a laminate method using a resin sheet. The filter chip 92 can be hermetically sealed with the resin 94 that contacts the seal ring 88. The other structures of the third variation are the same as those of the first embodiment illustrated in FIGS. 1A through 1E.

Figure 13A:
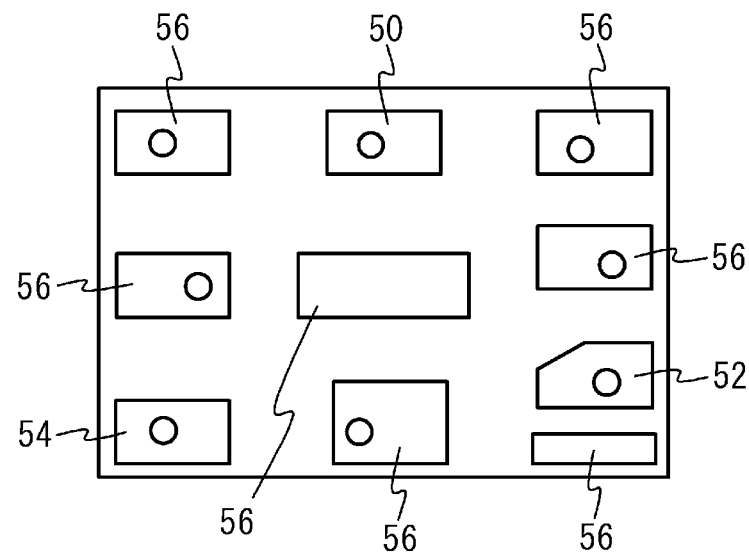
FIG. 13A illustrates an exemplary structure in which a ground terminal is further provided in the center of the back surface of the multilayer substrate.
Figure 13B:
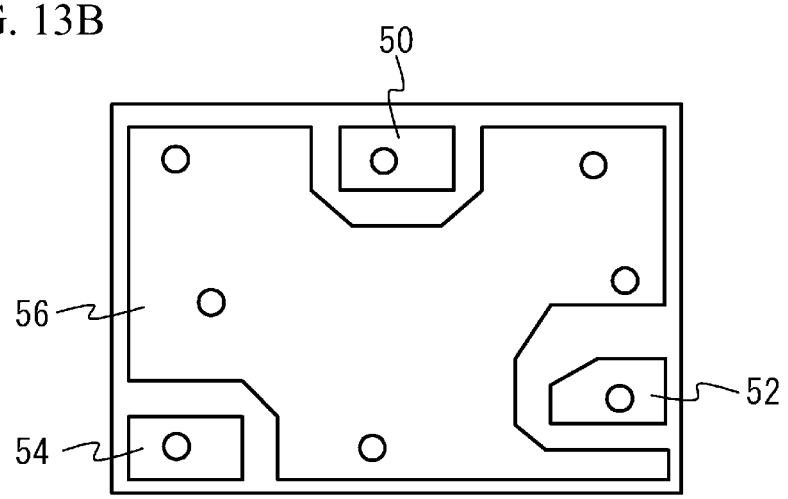
FIG. 13B illustrates an exemplary structure in which ground terminals provided on the back surface of the multilayer substrate are incorporated with each other to form a single piece.

The ground terminals 56 provided on the back surface of the multilayer substrate 10 of the first embodiment are not limited to the arrangement illustrated in FIG. 4E. This arrangement is briefly described here again. Three ground terminals 56 are respectively arranged in the vicinities of the centers of the second side 60, the third side 62 and the fourth side 64. One ground terminal 56 is provided in the vicinity of the corner defined by the first side 58 and the second side 60. One ground terminal 56 is provided in the vicinity of the corner defined by the third side 58 and the third side 62. One ground terminal 56 is provided between the transmission terminal 52 and the fourth side 64. FIG. 13A illustrates another arrangement of the ground terminals 56. Referring to FIG. 13A, one ground terminal 56 is provided in the center of the back surface of the multilayer substrate 10. FIG. 13B illustrates yet another arrangement of the ground terminals 56. Referring to FIG. 13B, the ground terminals 56 in FIG. 13A are connected together so that a single ground terminal 56 is formed on the back surface of the multilayer substrate 10. The single ground terminal 56 is formed so as to surround the antenna terminal 50, the transmission terminal 52 and the first reception terminal 54. The arrangements in FIGS. 13A and 13B surround the transmission terminal 52 more widely than the arrangement illustrated in FIG. 4E. It is thus possible to more effectively reduce the influence of the electromagnetic coupling between the transmission terminal 52 and the first reception terminal 54.

Second Embodiment

A second embodiment is an exemplary duplexer in which the ground terminal 56 is provided so as to surround the periphery of the transmission terminal 52 in four directions. The second embodiment is the same as the first embodiment illustrated in FIGS. 1A through 5 except that the second embodiment employs a pattern of the boot pads 36 on the lower surface of the line pattern/foot pad layer 30, which pattern is different from that of the first embodiment. Thus, a description is mainly given of the lower surface of the line pattern/foot pad layer 30.

Figure 14:
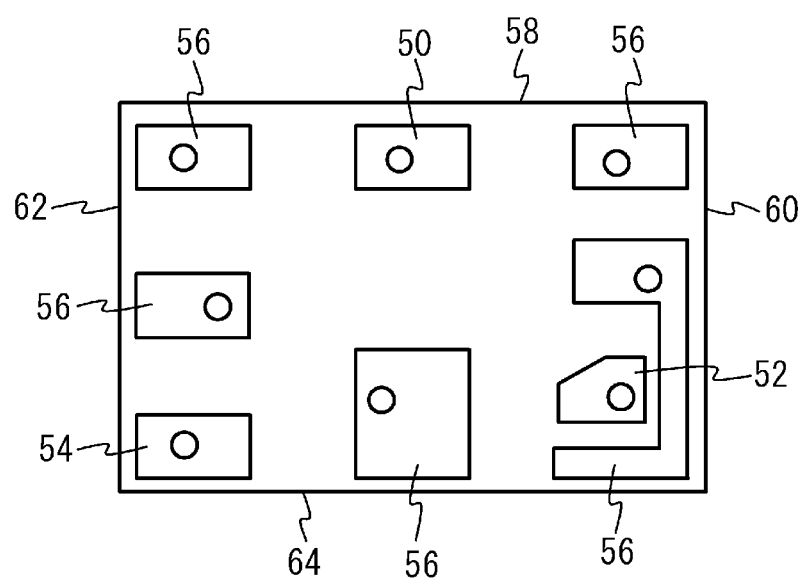
FIG. 14 is a bottom view of a line pattern/foot pad layer used in a second embodiment.

FIG. 14 is a diagram that illustrates an exemplary back or lower surface of the line pattern/foot pad layer 30. Referring to FIG. 14, there are provided five ground terminals 56. One of the ground terminals 56 is provided in the vicinity of the center of the fourth side 64 and is interposed between the transmission terminal 52 and the first reception terminal 54. Another one of the ground terminals 56 has a portion provided between the transmission terminal 52 and the fourth side 64, another portion provided between the transmission terminal 52 and the second side 60, and yet another portion provided in the vicinity of the center of the second side 60. Thus, the transmission terminal 52 is surrounded in the four directions.

Figure 15A:
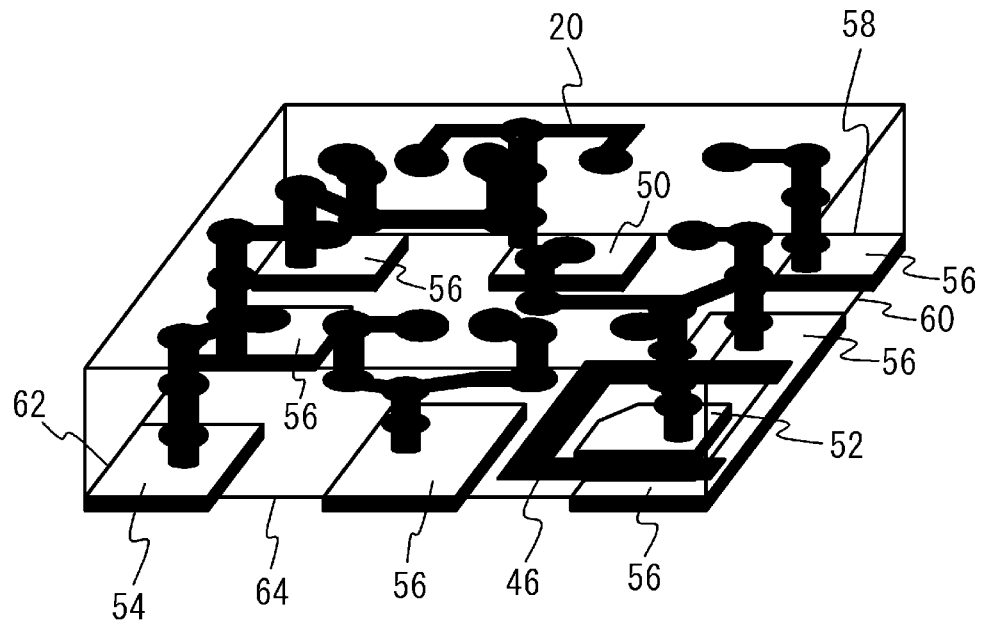
FIG. 15A is a perspective view of a duplexer according to the second embodiment.
Figure 15B:
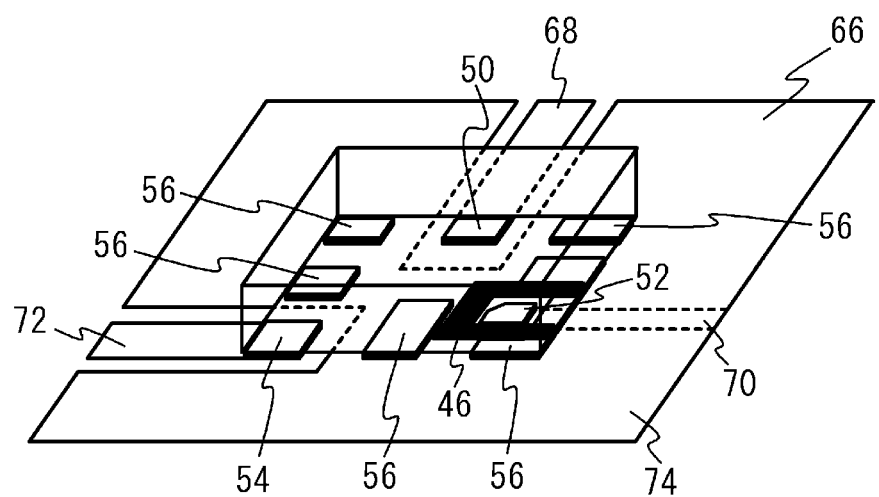
FIG. 15B is a perspective view of an electronic device in which the duplexer of the second embodiment is mounted on a printed-circuit board.

FIG. 15A is a perspective view of the duplexer of the second embodiment, and FIG. 15B is a perspective view of an electronic device in which the duplexer of the second embodiment is mounted on a printed-circuit board. Referring to FIG. 15A, the ground terminal 56 is provided between the transmission terminal 52 and the second side 60, so that the transmission terminal 52 is surrounded in the four directions. The other structures of the second embodiment are the same as those of the first embodiment illustrated in FIG. 5, and a description thereof is omitted here. As illustrated in FIG. 15B, since the ground terminal 56 is provided between the transmission terminal 52 and the second side 60, the ground line 74 on the printed-circuit board 66 is provided around the transmission signal line 70 to which the transmission terminal 52 is connected. Thus, the transmission signal line 70 is provided within the printed-circuit board 66 except the portion thereof to which the transmission terminal 52 is connected. The other structures of the second embodiment are the same as those of the first embodiment illustrated in FIG. 7A, and a description thereof is omitted here.

As described above, according to the second embodiment, the ground terminal 56 is provided between the transmission terminal 52 and the first reception terminal 54 in addition to the ground terminal 56 in the vicinity of the center of the second side 60, the ground terminal 56 in the vicinity of the center of the fourth side 64 and interposed between the transmission terminal 52 and the first reception terminal 54, and the ground terminal 56 between the transmission terminal 52 and the second side 60. Thus, on the back surface of the line pattern/foot pad layer 30, the transmission terminal 52 is electromagnetically shielded in the direction towards the first reception terminal 54, two directions orthogonal thereto, and the direction opposite to the direction towards the first reception terminal 54. It is thus possible to block the electromagnetic waves radiated in the direction towards the first reception terminal 54, the two directions orthogonal thereto, and the direction opposite to the direction towards the first reception terminal 54 and to more effectively shield the transmission terminal 52. It is thus possible to reduce the electromagnetic coupling between the transmission terminal 52 and the first reception terminal 54 and further improve the isolation characteristic.

The first conductor 46 surrounds the area formed by projecting the transmission terminal 52 in the direction towards the first reception terminal 54 and the two directions orthogonal thereto, as illustrated in FIG. 15A. Preferably, the area formed by projecting the transmission terminal 52 is surrounded in the four directions by providing the ground terminal 56 between the transmission terminal 52 and the second side 60. In this case, the area is surrounded in the direction towards the first reception terminal 54, the two directions orthogonal thereto, and the direction opposite to the direction towards the first reception terminal 54. It is thus possible to more effectively shield the transmission terminal 52 and further reduce the electromagnetic coupling between the transmission terminal 52 and the first reception terminal 54.

The second embodiment is not limited to the above structure. For example, in the structure in which the first conductor 46 surrounds the area defined by projecting the first reception terminal 54, an additional ground terminal 56 may be provided between the first reception terminal 54 and the third side 62 in addition to the ground terminal between the first reception terminal 54 and the fourth side 64. Thus, the peripheries of the first reception terminal 54 are surrounded by the ground terminals 56 in the four directions. Therefore, it is possible to reduce the electromagnetic coupling between the transmission terminal 52 and the first reception terminal 54 and improve the isolation characteristic. Preferably, as described above, the first conductor 46 surrounds the area defined by projecting the transmission terminal 52 or the area defined by projecting the first reception terminal 54. The ground terminal 56 is positioned below the first conductor 46 and is interposed between the transmission terminal 52 and the second side 60 or between the first reception terminal 54 and the fourth side 64.

The second embodiment may be varied so that the single-piece ground terminal 56 is divided into a separate ground terminal in the vicinity of the center of the second side 60, another separate ground terminal between the transmission terminal 52 and the second side 60 and yet another separate ground terminal between the transmission terminal 52 and the fourth side 64. However, it is preferable to employ the single-piece ground terminal 56 in order to shield the transmission terminal 52 more effectively.

The second embodiment may be varied so that the additional ground terminal 56 is provided in the center of the back surface of the multilayer substrate 10 as in the case of the first embodiment. The ground terminals 56 on the back surface of the multilayer substrate 10 may be incorporated with each other to form a single-piece ground terminal.

Third Embodiment

A duplexer of a third embodiment has an exemplary structure in which the first conductor 46 surrounds both the area defined by projecting the transmission terminal 52 and the area defined by projecting the first reception terminal 54. The duplexer of the third embodiment is the same as the duplexer of the first embodiment illustrated in FIGS. 1A through 5 except the pattern of the first conductor 46 formed on the upper surface of the line pattern/foot pad layer 30 and the pattern of the foot pads 36 formed on the lower or back surface thereof.

The multilayer substrate 10 of the third embodiment 3 is described with reference to FIGS. 16A through 16E. As illustrated in FIG. 16D, the first conductor 46 provided on the upper surface of the line pattern/foot pad layer 30 surrounds both the area defined by projecting the transmission terminal 52 thereon (an area defined by a broken line) and the area defined by projecting the first reception terminal 54 thereof (another area defined by another broken line).

Figure 16C:
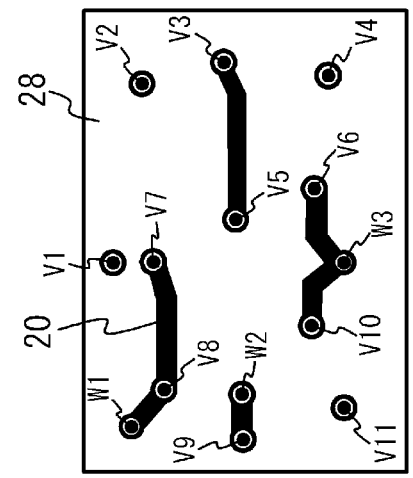
FIG. 16C is a plan view of a line pattern layer of the third embodiment.
Figure 16B:
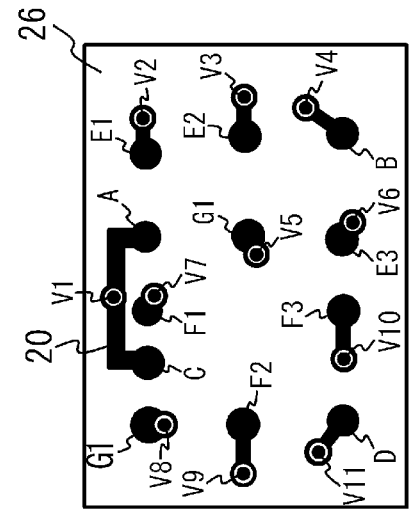
FIG. 16B is a plan view of a die attach layer of the third embodiment.
Figure 16A:
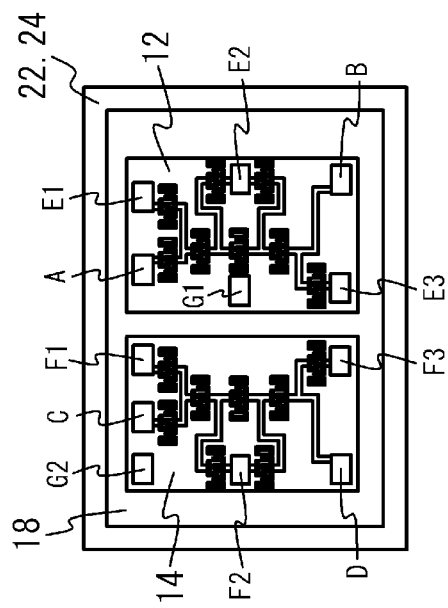
FIG. 16A is a view of a cap mount layer and a cavity layer of a third embodiment.
Figure 16E:
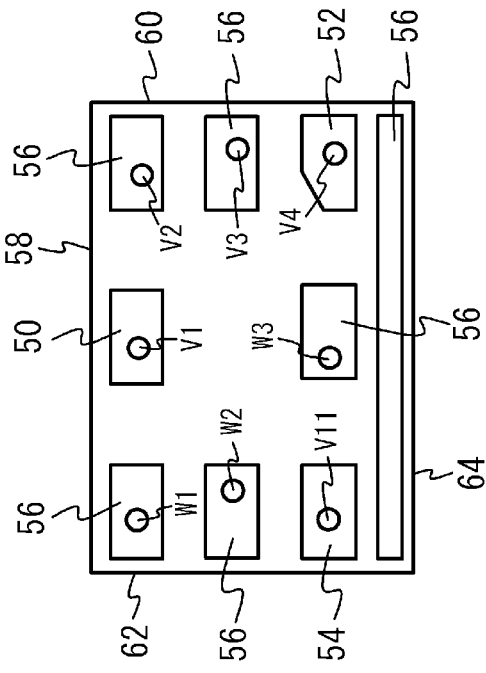
FIG. 16E is a bottom view of the line pattern/foot pad layer.
Figure 16D:
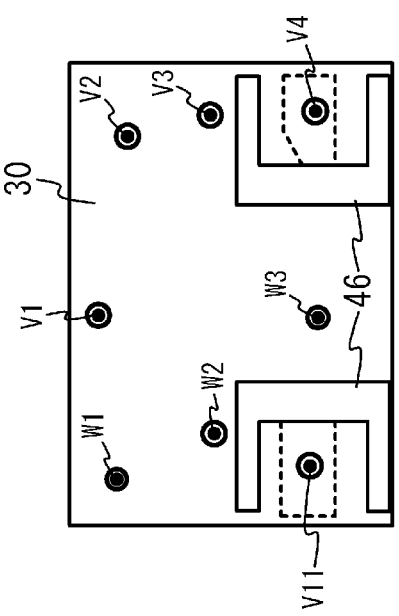
FIG. 16D is a plan view of a line pattern/foot pad layer of the third embodiment.

As illustrated in FIG. 16E, the ground terminal 56 provided on the back surface of the line pattern/foot pad layer 30 is provided between the transmission terminal 52 and the fourth side 64 and between the first reception terminal 54 and the fourth side 64. The ground terminal 56 is not limited to a single-piece terminal as illustrated in FIG. 16E but may be divided into separate parts.

Figure 17A:
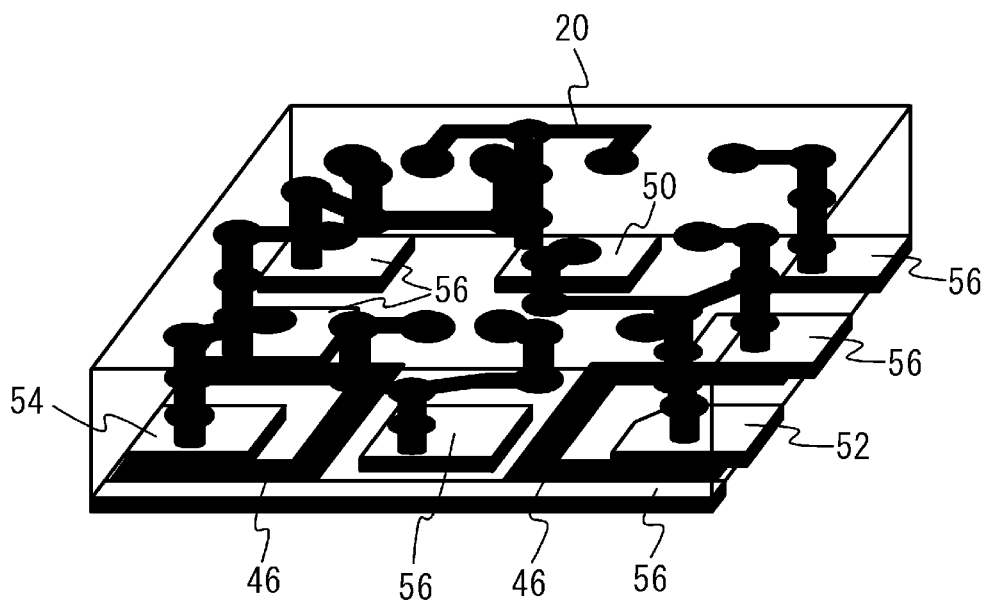
FIG. 17A is a perspective view of a duplexer of the third embodiment.
Figure 17B:
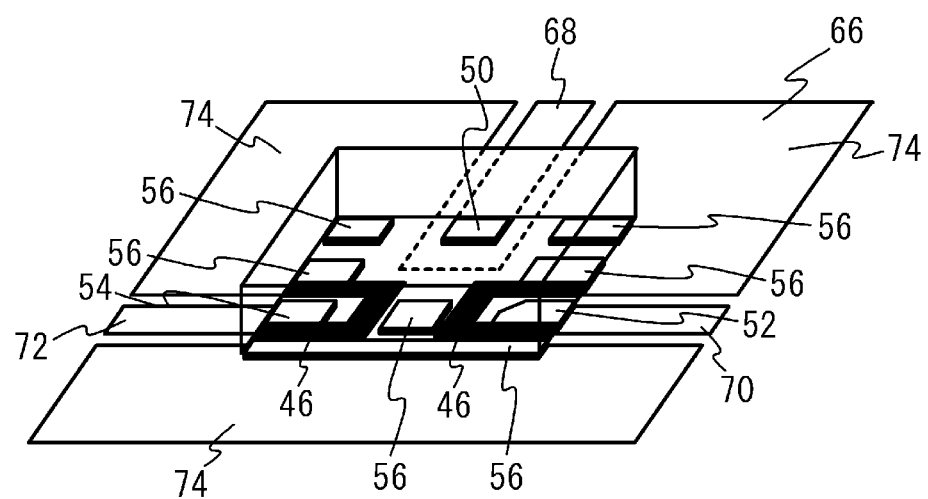
FIG. 17B is a perspective view of an electronic device in which the duplexer of the third embodiment is mounted on a printed-circuit board.

FIG. 17A is a perspective view of the duplexer of the third embodiment, and FIG. 17B is a perspective view of an electronic device in which the duplexer of the third embodiment is mounted on a printed-circuit board. As illustrated in FIG. 17A, the first conductor 46 is provided on the upper surface of the line pattern/foot pad layer 30 included in the multilayer substrate 10 so as to surround both the area defined by projecting the transmission terminal 52 and the area defined by projecting the first reception terminal 54. The ground terminals 56 are provided between the transmission terminal 52 and the fourth side 64 and between the first reception terminal 54 and the fourth side 64. As illustrated in FIG. 17B, the duplexer of the third embodiment is mounted on the printed-circuit board 66 as in the case of the first embodiment illustrated in FIG. 7A.

According to the third embodiment, the transmission terminal 52 is shielded in both the direction towards the first reception terminal 54 and the direction orthogonal thereto on the back surface of the multilayer substrate 10 and on the upper surface of the line pattern/foot pad layer 30. It is thus possible to block the electromagnetic waves emitted from the transmission terminal 52 in the above two directions. Similarly, the first reception terminal 54 is shielded in both the direction towards the transmission terminal 52 and the direction orthogonal thereto. It is thus possible to block the electromagnetic waves emitted from the transmission terminal 52 in the above two directions before the electromagnetic waves arrive at the first reception terminal 54. It is thus possible to further reduce the electromagnetic coupling between the transmission terminal 52 and the first reception terminal 54.

Figure 18A:
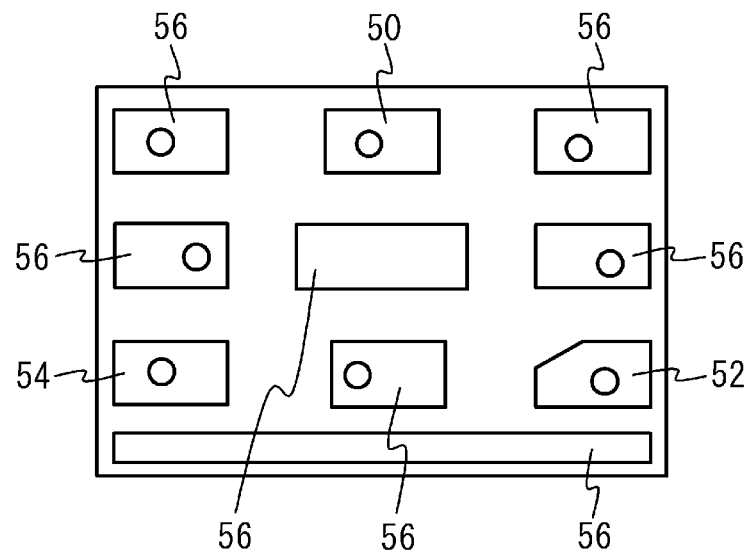
FIG. 18A illustrates an exemplary structure in which a ground terminal is further provided in the center of the back surface of the multilayer substrate.
Figure 18B:
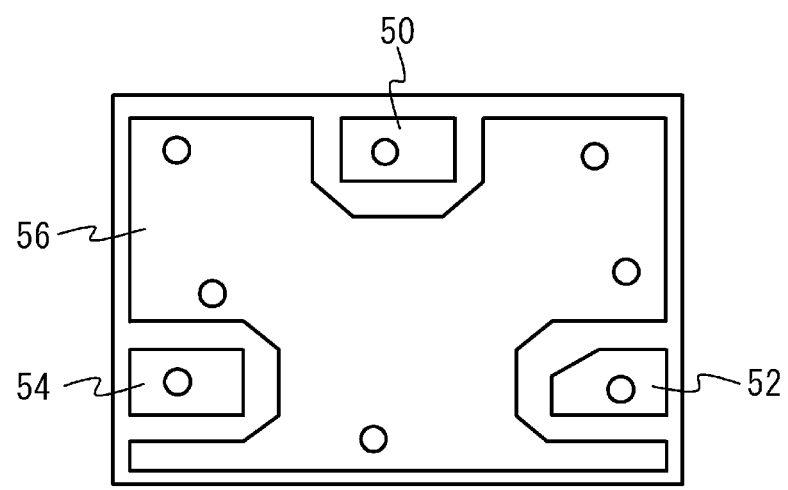
FIG. 18B illustrates an exemplary structure in which ground terminals are incorporated with each other to form a single piece.

The third embodiment may be varied to have the ground terminal 56 in the center of the back surface of the multilayer substrate 10 as in the case of the first embodiment. It is also possible to incorporate the ground terminals 56 with each other to form a single-piece ground terminal on the whole back surface of the multilayer substrate 10. FIG. 18A illustrates an exemplary structure in which the ground terminal 56 is provided in the center of the back surface of the multilayer substrate 10. FIG. 18B illustrates a single-piece ground terminal 56 provided on the whole back surface of the multilayer substrate 10.

Fourth Embodiment

A fourth embodiment has an exemplary structure in which the first conductor 46 surrounds both the area defined by projecting the transmission terminal 52 and the area defined by projecting the first reception terminal 54, and the ground terminal 56 surrounds the peripheries of the transmission terminal 52 and the first reception terminal 54 in the four directions. A duplexer of the fourth embodiment is the same as that of the third embodiment illustrated in FIGS. 16A through 16E except that the foot pad 36 formed on the lower surface of the line pattern/foot pad layer 30 of the multilayer substrate 10 has a different pattern. Thus, a description is given of only the back surface of the line pattern/foot pad layer 30.

Figure 19A:
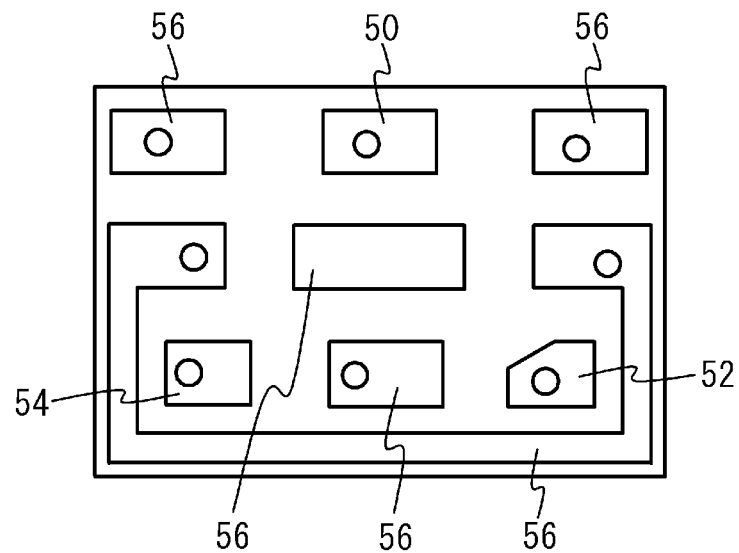
FIG. 19A is a bottom view of a line pattern/foot pad layer used in a fourth embodiment.
Figure 19B:
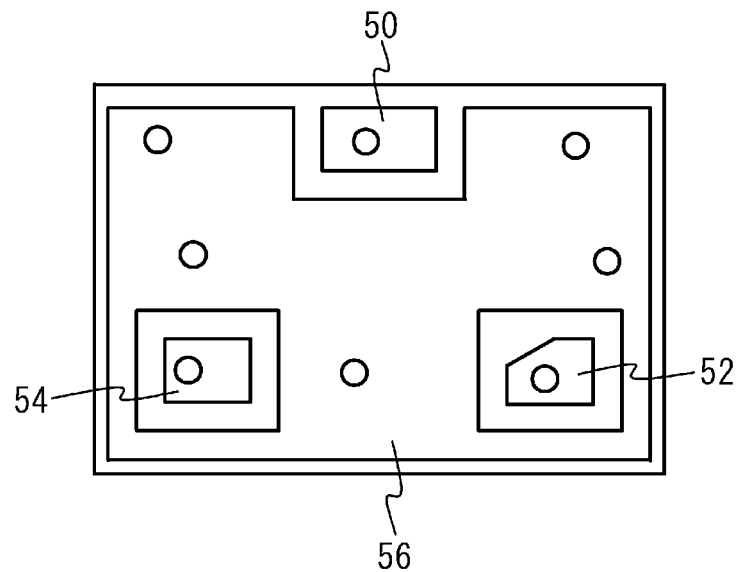
FIG. 19B is a bottom view of a line pattern/foot pad layer used in a first variation of the fourth embodiment.

FIG. 19A is a plan view of a back surface of the line pattern/foot pad layer employed in the fourth embodiment. Referring to FIG. 19A, the ground terminals 56 includes a unique ground terminal 56, which is provided between the transmission terminal 52 and the fourth side 64 and between the first reception terminal 54 and the fourth side 64. This unique ground terminal 56 is further located between the transmission terminal 52 and the second side 60 and between the first reception terminal 54 and the third side 62. The peripheries of the transmission terminal 52 are surrounded by the ground terminals 56 in the four directions, and the peripheries of the first reception terminal 54 are surrounded by the ground terminals 56 in the four directions. The unique ground terminal 56 is a single-piece pattern formed by joining the ground terminal located in the center of the second side 60, the ground terminal between the transmission terminal 52 and the second side 60, the ground terminal between the transmission terminal 52 and the fourth side 64, the ground terminal between the first reception terminal 54 and the fourth side 64, the ground terminal between the first reception terminal 54 and the third side 62, and the ground terminal located in the center of the third side 62. The unique ground terminal 56 may be varied so as to be divided into the separate ground terminals. However, it is preferable to use the single-piece ground terminal 56 because the single-piece ground terminal 56 surrounds the transmission terminal 52 and the first reception terminal 54 more sufficiently and improves the effect of shielding. The ground terminal 56 provided in the center of the back surface of the line pattern/foot pad layer 30 may be omitted. However, the presence of the center ground terminal 56 shields the transmission terminal 52 and the first reception terminal 54 more effectively. FIG. 19B illustrates a first variation of the fourth embodiment. Referring to FIG. 19B, the ground terminals 56 are joined together so as to surround the transmission terminal 52 and the reception terminal 54 so as to form a single-piece ground terminal 56 on the whole back surface of the line pattern/foot pad layer 30. This single-piece ground terminal 56 shields the transmission terminal 52 and the first reception terminal 54 more effectively.

Figure 20A:
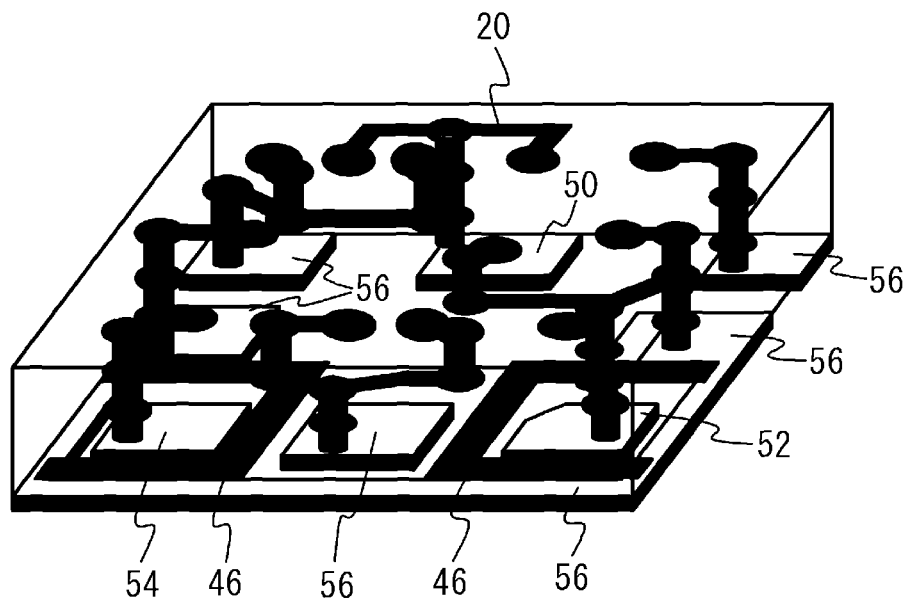
FIG. 20A is a perspective view of a duplexer of the fourth embodiment.
Figure 20B:
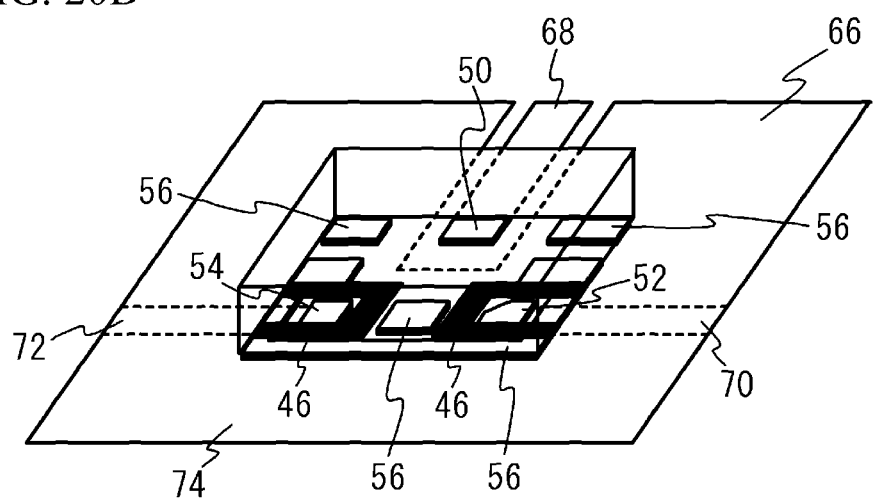
FIG. 20B is a perspective view of an electronic device in which the duplexer is mounted on a printed-circuit board.

FIG. 20A is a perspective view of a duplexer according to the fourth embodiment, and FIG. 20B is a perspective view of an electronic device in which the duplexer of the fourth embodiment is mounted on a printed-circuit board. Referring to FIG. 20A, the first conductor 46 is provided on the upper surface of the line pattern/foot pad layer 30 included in the multilayer substrate 10 so as to surround both the area defined by projecting the transmission terminal 52 and the area defined by projecting the first reception terminal 54. The single-piece ground terminal 56 is located between the transmission terminal 52 and the fourth side 64, between the first reception terminal 54 and the fourth side 64, and is further located between the transmission terminal 52 and the second side 60 and between the first reception terminal 54 and the third side 62. Since the ground terminal 56 is provided between the transmission terminal 52 and the second side 60 and between the first reception terminal 54 and the third side 62, the ground line 74 of the printed-circuit board 66 is provided so as to surround the periphery of a portion of the transmission signal line 70 connected to the transmission terminal 52 and that of a portion of the reception signal line 72 connected to the first reception terminal 54. The other portions of the transmission signal line 70 and the reception signal line 72 may be provided within the printed-circuit board 66. The remaining structures of the fourth embodiment are the same as those of the first embodiment, and a description thereof is omitted here.

In the duplexer of the fourth embodiment, the transmission terminal 52 is electromagnetically shielded in the direction towards the first reception terminal 54 and the direction orthogonal thereto on the upper surface of the line pattern/foot pad layer 30. Further, on the back surface of the multilayer substrate 10, the transmission terminal 52 is electromagnetically shielded in the direction towards the first reception terminal 54, the direction orthogonal thereto, the direction opposite to the first reception terminal 54 and the direction orthogonal thereto. Similarly, the first reception terminal 54 is electromagnetically shielded in the direction towards the transmission terminal 52 and the direction orthogonal thereto on the upper surface of the line pattern/foot pad layer 30. Further, the first reception terminal 54 is electromagnetically shielded in the direction towards the transmission terminal 52, the direction orthogonal thereto, and the direction opposite to the transmission terminal 52 on the back surface of the multilayer substrate 10. It is thus possible to further improve the effect of shielding the transmission terminal 52 and the first reception terminal 54. Thus, the electromagnetic coupling between the transmission terminal 52 and the first reception terminal 54 can be further reduced, and the isolation characteristic can be further improved.

Fifth Embodiment

A duplexer of a fifth embodiment has an exemplary structure having a second conductor that covers the area defined by projecting the transmission terminal 52. The duplexer of the fifth embodiment is the same as that of the first embodiment illustrated in FIGS. 1A through 5 except a pattern formed on the upper surface of the line pattern layer 28 included in the multilayer substrate 10.

A description is now given of a structure of the multilayer substrate 10 employed in the fifth embodiment with reference to FIGS. 21A through 21E. Referring to FIG. 21C, a second conductor 96 is provided on the upper surface of the line pattern layer 28, and is formed so as to cover the area defined by projecting the transmission terminal 52 onto the line pattern layer 28. The second conductor 96 may be made of the same material as that of the conductive pattern 20 and may be an alloy including, for example, Al and Cu. The second conductor 96 is not electrically connected to the other conductive pattern 20 but is a floating conductor. The second conductor 96 may have the same thickness as the conductive pattern 20 and may be 15 μm thick, for example.

Figure 22A:
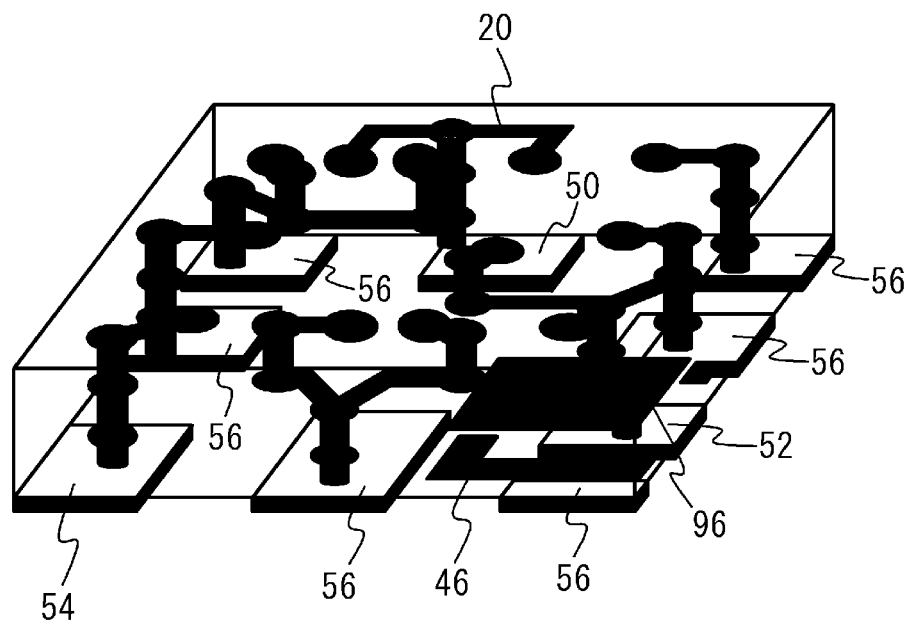
FIG. 22A is a perspective view of a duplexer of the fifth embodiment.
Figure 22B:
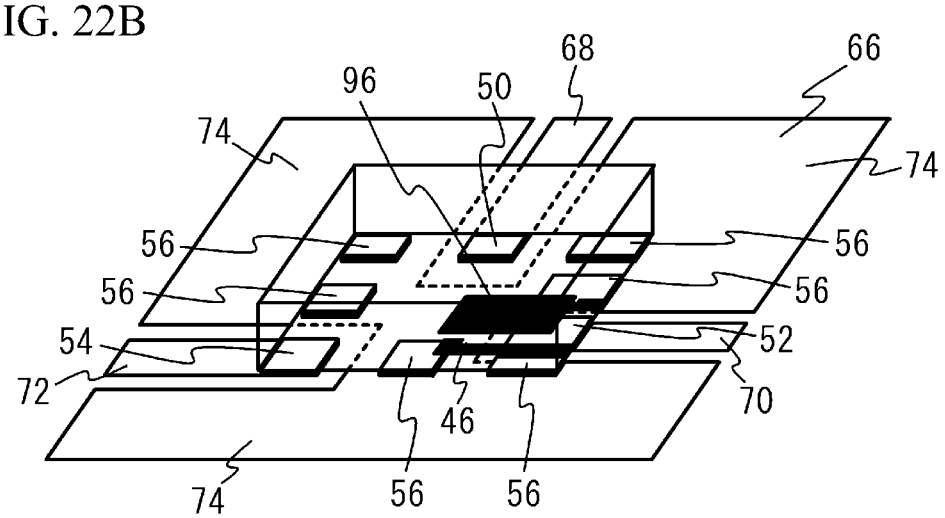
FIG. 22B is a perspective view of an electronic device in which the duplexer is mounted on a printed-circuit board.

FIG. 22A is a perspective view of the duplexer of the fifth embodiment, and FIG. 22B is a perspective view of an electronic device in which the duplexer of the fifth embodiment is mounted on a printed-circuit board. The view of FIG. 22A is seen through structural components other than the conductive pattern 20, the foot pads 56, the first conductor 46 and the second conductor 96 (this holds true for FIG. 24A). Similarly, the view of FIG. 22B is seen through structural components other than the foot pads 36, the first conductor 46 and the second conductor 96 (this holds true for FIG. 24B). As illustrated in FIG. 22A, the second conductor 96 is provided on the upper surface of the line pattern layer 28 that is the upper surface of the line pattern/foot pad layer 30 included in the multilayer substrate 10 so as to cover the area defined by projecting the transmission terminal 52 onto the upper surface of the line pattern layer 28. As illustrated in FIG. 22B, the duplexer of the fifth embodiment is mounted on the printed-circuit board 66 as in the case of the first embodiment.

Figure 23A:
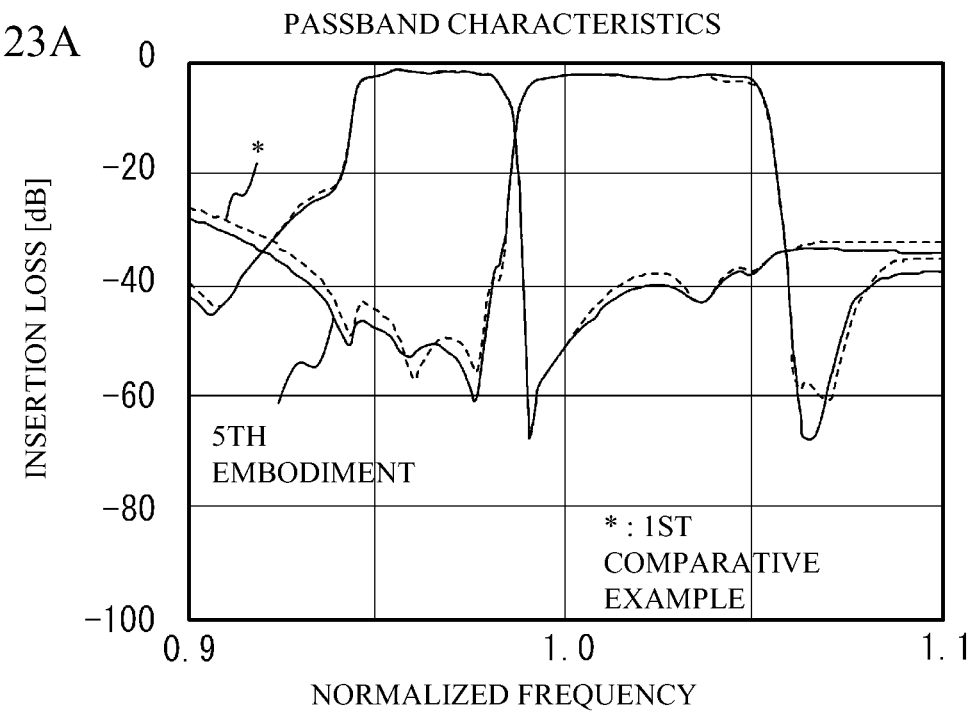
FIG. 23A illustrates passband characteristics of transmission and reception filters.
Figure 23B:
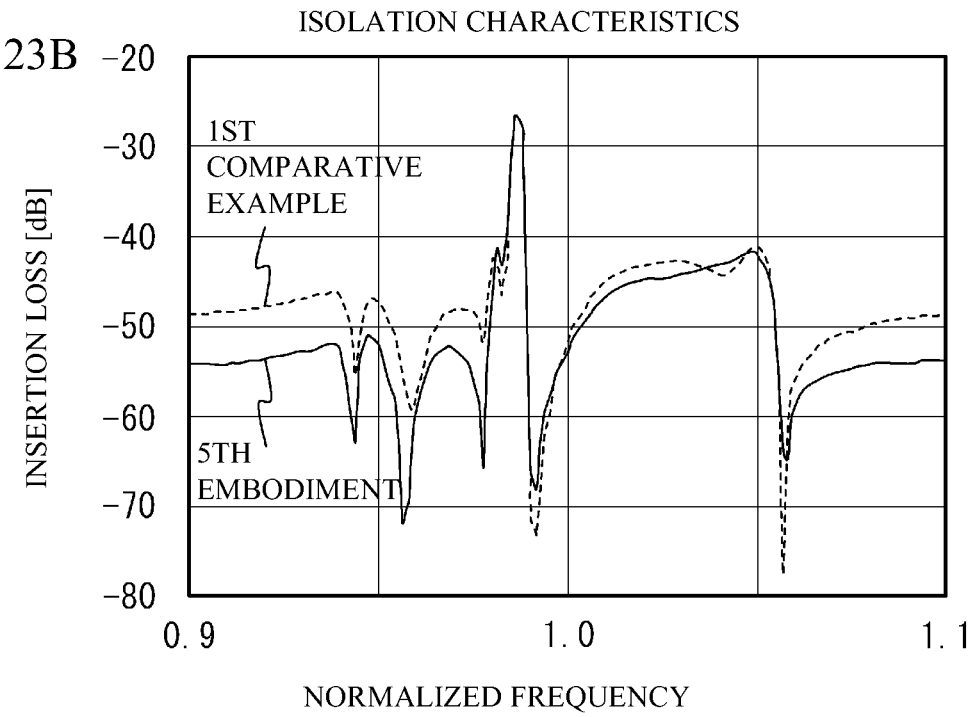
FIG. 23B illustrates isolation characteristics between the transmission and reception terminals.

The electronic device illustrated in FIG. 22B is simulated to measure the passband characteristics of the transmission filter 12 and the reception filter 14 and the isolation characteristics between the transmission terminal 52 and the first reception terminal 54. Simulation results of the electronic device illustrated in FIG. 7B are illustrated for the purpose of comparison with the electronic device illustrated in FIG. 7B. FIG. 23A illustrates simulation results of passband characteristics of the transmission filter 12 and the reception filter 14 of the first comparative example and the fifth embodiment, and FIG. 23B illustrates simulation results of the isolation characteristics between the transmission terminal 52 and the first reception terminal 54 of the first comparative example and the fifth embodiment. The simulation results of the fifth embodiment are illustrated by solid lines, and those of the first comparative example are illustrated by broken lines.

As illustrated in FIG. 23A, the fifth embodiment and the first comparative example have little difference in the passband characteristics of the transmission filter 12 and the reception filter 14. In contrast, as illustrated in FIG. 23B, the fifth embodiment has improved isolation characteristics between the transmission terminal 52 and the first reception terminal 54 in the transmission band and outsides of the passband, as compared with the first comparative example.

According to the fifth embodiment, the upper side of the transmission terminal 52 is electromagnetically shielded, and electromagnetic waves emitted upwards from the transmission terminal 52 are blocked. It is thus possible to improve the effect of shielding the transmission terminal 52 and to further reduce the electromagnetic coupling between the transmission terminal 52 and the first reception terminal 54. Thus, the isolation characteristic can be further improved, as illustrated in FIG. 23B.

It is preferable that the second conductor 96 completely covers the area defined by projecting the transmission terminal 52 in order to improve the effect of blocking the electromagnetic waves emitted from the transmission terminal 52. However, a similar effect of blocking may be obtained even by partly covering the area defined by projecting the transmission terminal 52.

The second conductor 96 is not limited to the above arrangement but may be varied. For example, it is preferable that the second conductor 96 covers the area defined by projecting the first reception terminal 54 in a case where the first conductor 46 covers this area. It is thus possible to further reduce the electromagnetic coupling between the transmission terminal 52 and the first reception terminal 54.

The second conductor 96 may be provided to cover the area defined by projecting the transmission terminal 52 in a case where the first conductor 46 is provided to surround the area defined by projecting the transmission terminal 52 and the ground terminal 56 is provided between the transmission terminal 52 and the second side 60 and between the transmission terminal 52 and the fourth side 64. Such a case is employed in the second embodiment. Similarly, the second conductor 96 may be provided to cover the area defined by projecting the first reception terminal 54 in the case where the first conductor 46 surrounds the area defined by projecting the first reception terminal 54 and the ground terminal 56 is provided between the first reception terminal 54 and the third side 62 and between the first reception terminal 54 and the fourth side. In the cases described above, the electromagnetic coupling between the transmission terminal 52 and the first reception terminal 54 can be further reduced.

The second conductor 96 is not limited to the floating conductor but may be grounded. The second conductor 96 is not connected to signal lines connected to the antenna terminal 50, the transmission terminal 52 and the first reception terminal 54.

Sixth Embodiment

Figure 24A:
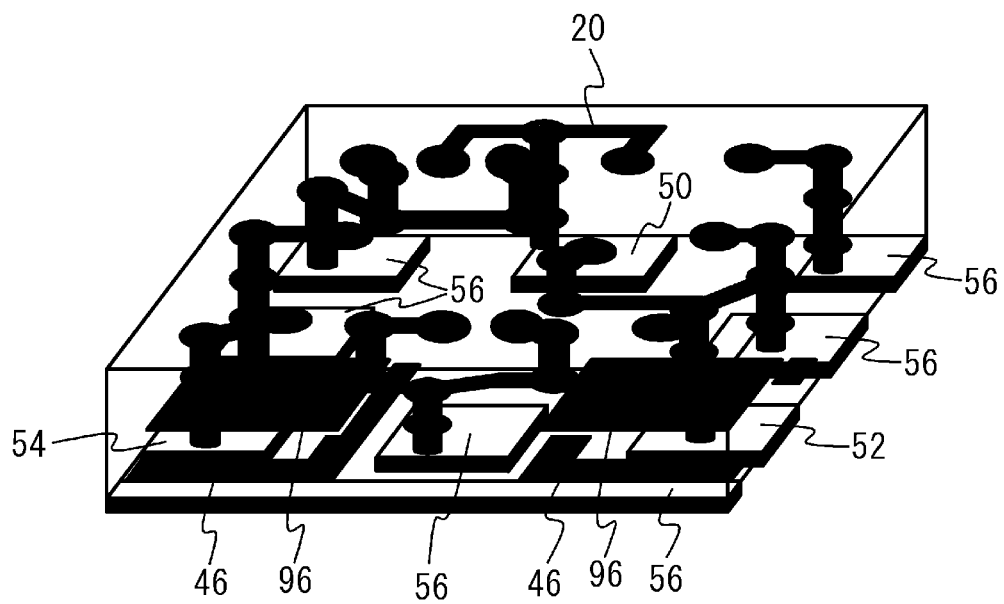
FIG. 24A is a perspective view of a duplexer according to a sixth embodiment.
Figure 24B:
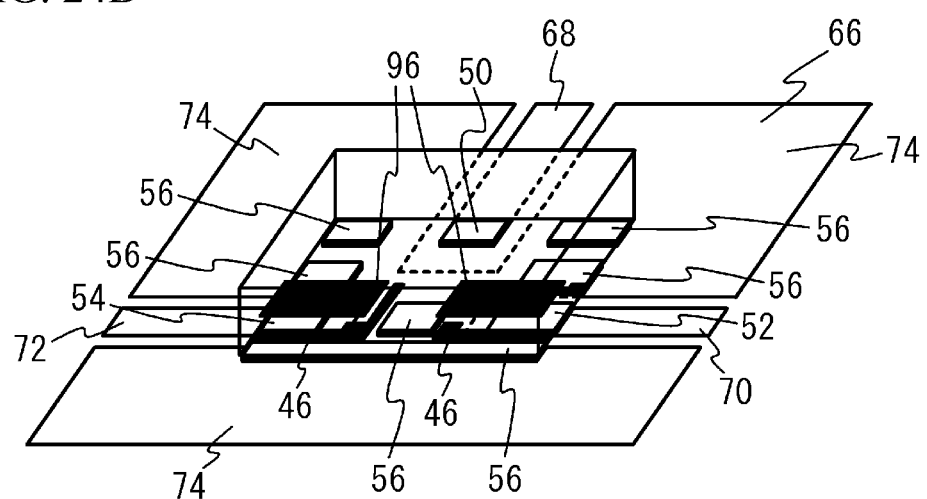
FIG. 24B is a perspective view of an electronic device in which the duplexer is mounted on a printed-circuit board.

A duplexer of a sixth embodiment has an exemplary structure in which the second conductor 96 is provided so as to cover both the area defined by projecting the transmission terminal 52 and the area defined by projecting the first reception terminal 54. FIG. 24A is a perspective view of the duplexer of the sixth embodiment, and FIG. 24B is a perspective view of an electronic device in which the duplexer of the sixth embodiment is mounted on a printed-circuit board. As illustrated in FIG. 24A, the first conductor 46 is provided so as to surround both the area defined by projecting the transmission terminal 52 onto the upper surface of the line pattern/foot pad layer 30 and the area defined by projecting the first reception terminal 54 onto the upper surface of the line pattern/foot pad layer 30. The second conductor 96 is provided so as to cover both the area defined by projecting the transmission terminal 52 onto the upper surface of the line pattern layer 28 and the area defined by projecting the first reception terminal 54 onto the upper surface of the line pattern layer 28. The ground terminal 56 is provided on the back surface of the multilayer substrate 10 so as to be located between the transmission terminal 52 and the fourth side 64 and between the first reception terminal 54 and the fourth side 64. As illustrated in FIG. 24B, the duplexer of the sixth embodiment is mounted on the printed-circuit board 66 as in the case of the first embodiment illustrated in FIG. 7A.

According to the sixth embodiment, the upper sides of both the transmission terminal 52 and the first reception terminal 54 are electromagnetically shielded. It is thus possible to block electromagnetic waves emitted upwards from the transmission terminal 52 and blocks the waves before the electromagnetic waves arrive at the first reception terminal 54 from the upper side. It is thus possible to further reduce the electromagnetic coupling between the transmission terminal 52 and the first reception terminal 54 and to further improve the isolation characteristic therebetween.

The second conductor 96 may be provided so as to cover the areas respectively defined by projecting the transmission terminal 52 and the first reception terminal 54 in the case where the ground terminal 56 is provided between the transmission terminal 52 and the second side 60 and between the first reception terminal 54 and the third side 62. It is possible to reduce the electromagnetic coupling between the transmission terminal 52 and the first reception terminal 54.

Seventh Embodiment

Figure 25A:
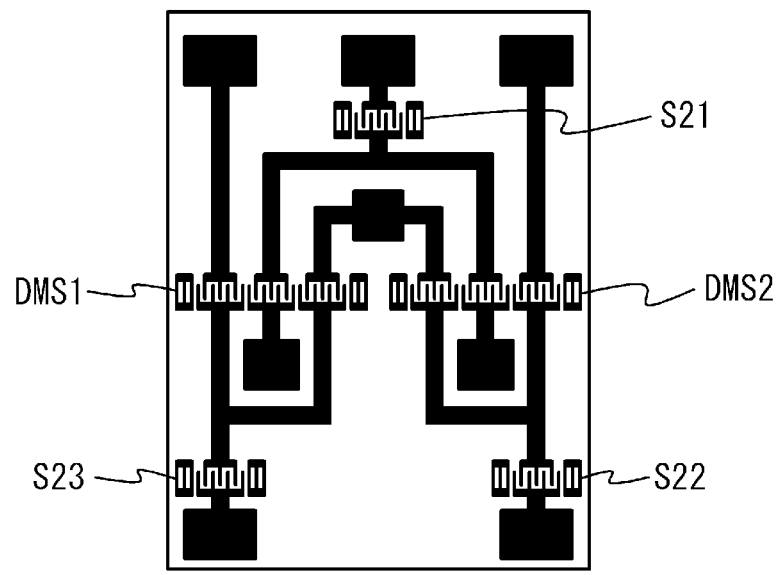
FIG. 25A is a plan view of a reception filter.
Figure 25B:
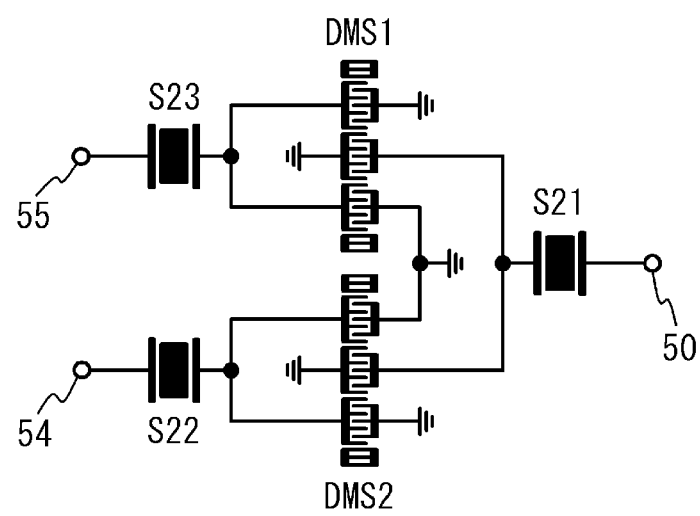
FIG. 25B is a circuit diagram of the reception filter.

A duplexer of a seventh embodiment has an exemplary structure in which the transmission filter 12 is of ladder type like the first embodiment and the reception filter 14 is a double-mode filter. FIG. 25A is a plan view of the reception filter 14, and FIG. 25B is a circuit diagram of the reception filter 14. Referring to FIGS. 25A and 25B, the reception filter 14 has double mode type surface acoustic wave resonators DMS1 and DMS2 connected in parallel. Each of DMS1 and DMS2 has three interdigital transducers (IDT) interposed between a pair of reflection electrodes. The IDT located in the center of each of DMS1 and DMS2 is coupled to the antenna terminal 50 via a resonator S21. The antenna terminal 50 is an unbalanced terminal. Two IDTs located at both sides of the center IDT of DMS1 are coupled to a second reception terminal 55 via a resonator S23. Similarly, two IDTs located at both sides of the center IDT of DMS2 are coupled to the first reception terminal 54 via a resonator S22. The first and second reception terminals 54 and 55 are balanced terminals. The duplexer of the seventh embodiment is a unbalanced-balanced type duplexer.

Figure 26A:
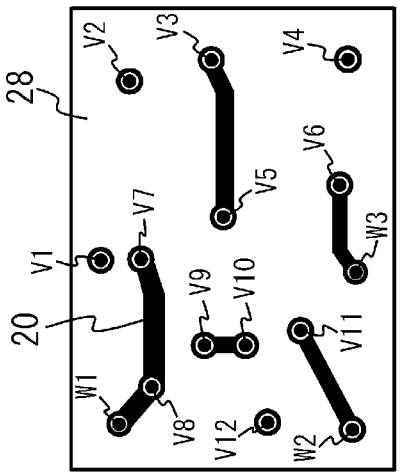
FIG. 26A is a view of a cap mount layer and a cavity layer of a sixth embodiment.

A description is given of each layer of the multilayer substrate 10 with reference to FIGS. 26A through 26E. As illustrated in FIG. 26A, holes for defining the cavity 18 are formed in the cap mount layer 22 and the cavity layer 24. The transmission filter 12 of the ladder type and the reception filter 14 of the double mode type are housed in the cavity 18.

Figure 26B:
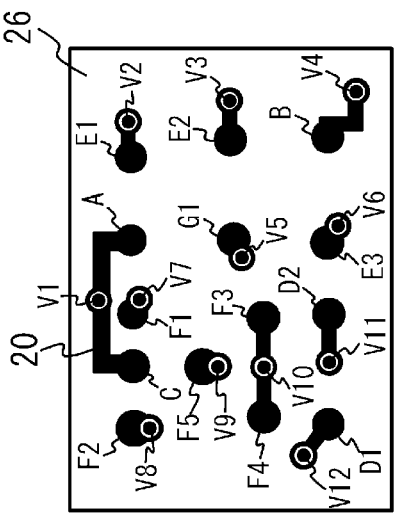
FIG. 26B is a die attach layer of the sixth embodiment.
Figure 26C:
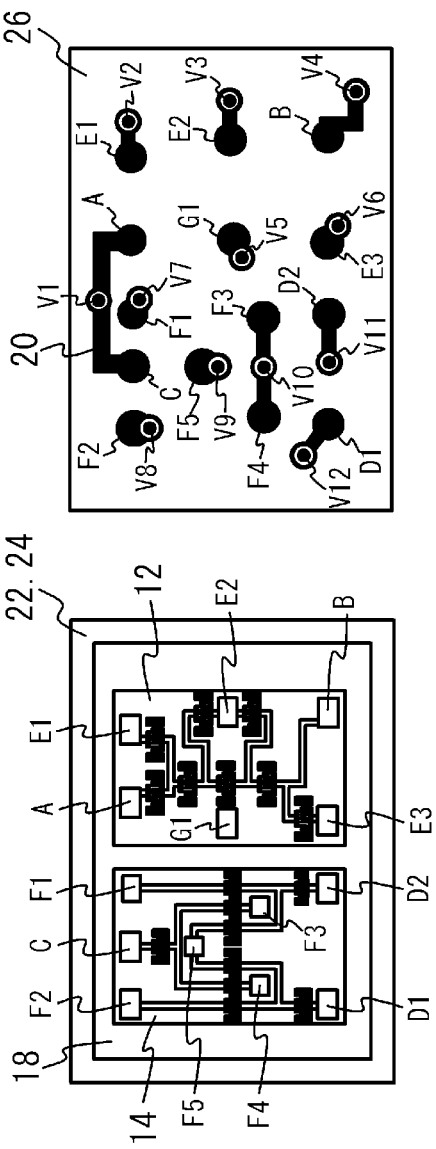
FIG. 26C is a plan view of a line pattern layer of the sixth embodiment.

As illustrated in FIGS. 26B and 26C, the conductive patterns 20 are provided on the upper surface of the die attach layer 26 and the upper surface of the line pattern layer 28.

Figure 26D:
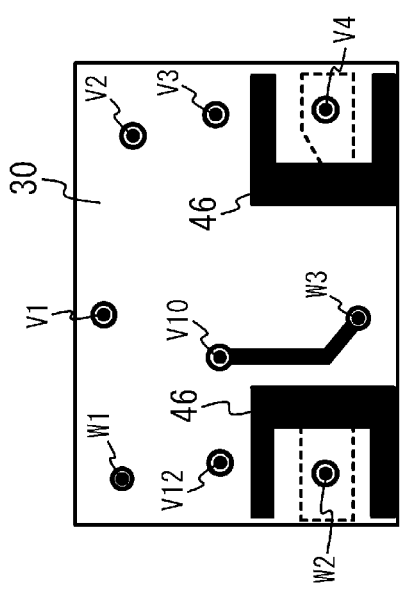
FIG. 26D is a plan view of a line pattern/foot pad layer of the sixth embodiment.

As illustrated in FIG. 26D, in addition to the conductive pattern 20, the first conductor 46 is provided on the upper surface of the line pattern/foot pad layer 30 so as to surround the area defined by projecting the transmission terminal 52 than the area defined by projecting the first reception terminal 54 closer to the transmission terminal 52 than the second reception terminal 55.

Figure 26E:
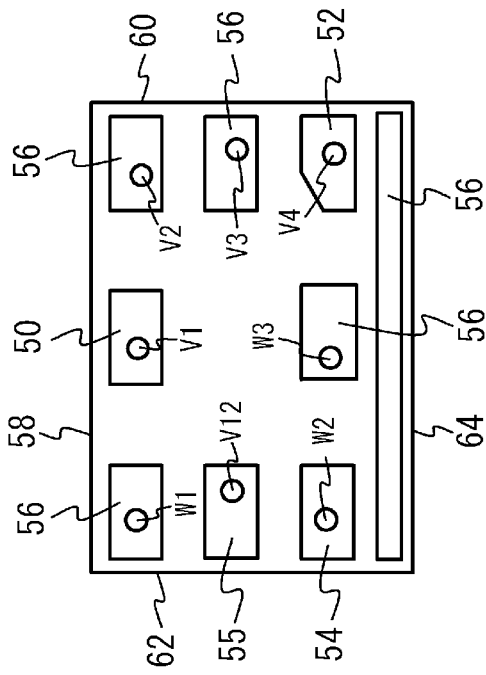
FIG. 26E is a bottom view of the line pattern/foot pad layer.

As illustrated in FIG. 26E, the first reception terminal 54 is provided close to the third side 62 and is located farther away from the antenna terminal 50 than the center of the third side 62. The second reception terminal 55 is provided close to the center of the third side 62 and is next to the first reception terminal 54. Thus, the ground terminal 56 is not provided close to the center of the third side 62. This is different from the arrangements illustrated in FIGS. 4E and 16E. The other structures of the seventh embodiment are the same as those of the third embodiment illustrated in FIG. 16E, and a description thereof is omitted here.

Figure 27A:
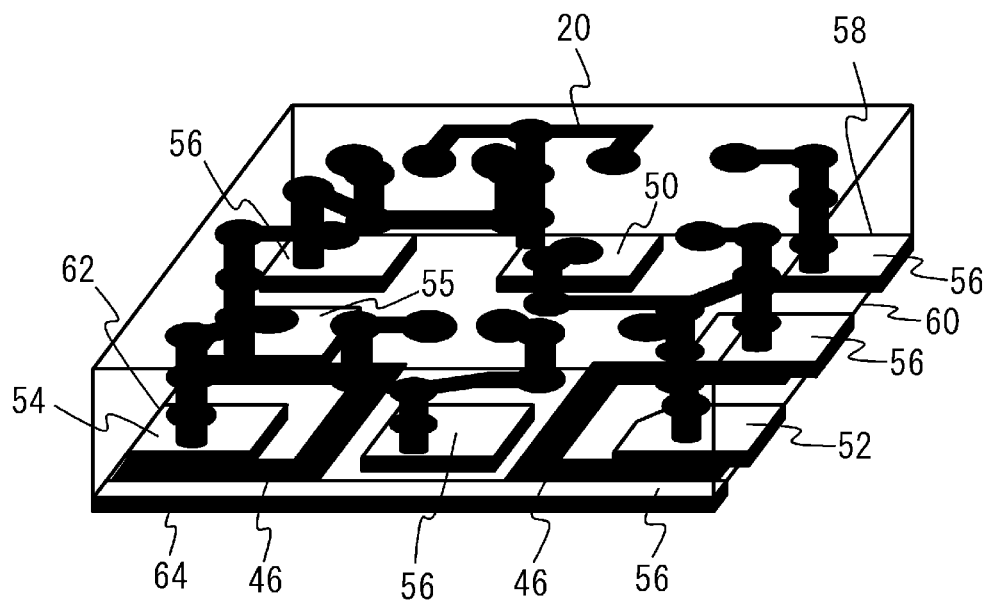
FIG. 27A is a perspective view of a duplexer according to a seventh embodiment.
Figure 27B:
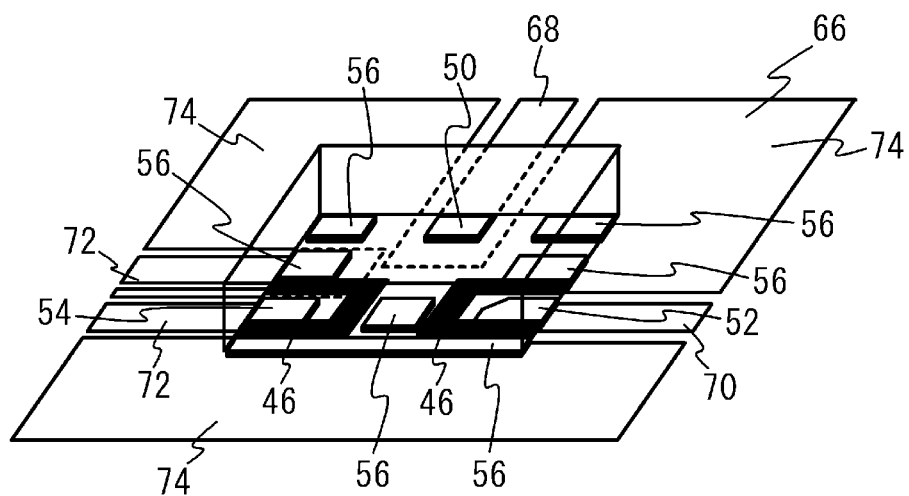
FIG. 27B is a perspective view of an electronic device in which the duplexer is mounted on a printed-circuit board.
Figure 28A:
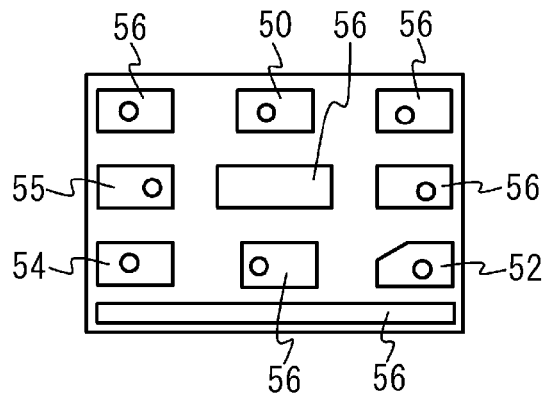
FIGS. 28A through 28F illustrate variations of the line pattern/foot pad layer with two reception terminals.
Figure 28B:
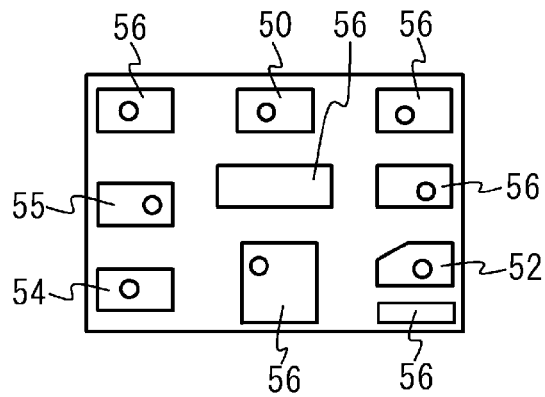
Figure 28C:
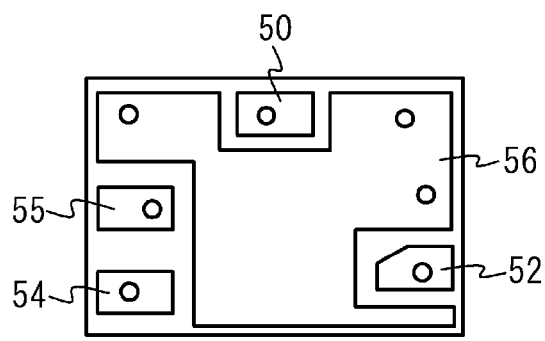
Figure 28D:
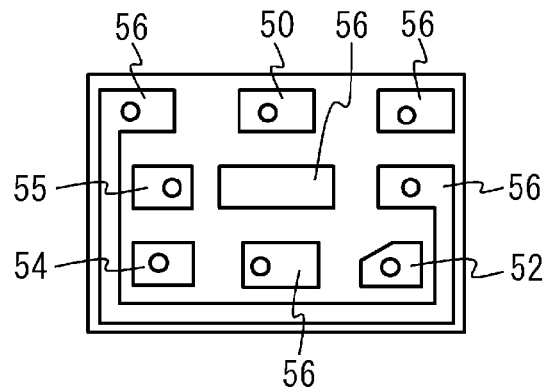
Figure 28E:
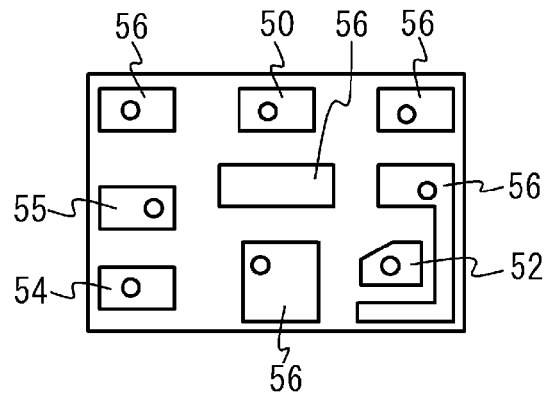
Figure 28F:
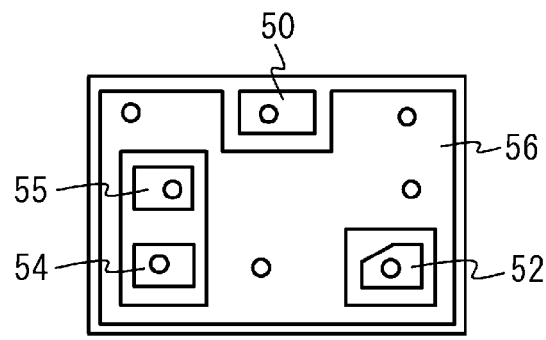

FIG. 27A is a perspective view of the duplexer of the seventh embodiment, and FIG. 27B is a perspective view of an electronic device in which the duplexer is mounted on a printed-circuit board. As illustrated in FIG. 27A, the first reception terminal 54 is provided close to the third side 62 and is located farther away from the antenna terminal 50 than the center of the third side 62. The second reception terminal 55 is provided close to the center of the third side 62 and is next to the first reception terminal 54. The first conductor 46 surrounds the areas respectively defined by projecting the transmission terminal 52 and the first reception terminal 54. As illustrated in FIG. 27B, reception signal lines 72 are provided in association with the first and second reception terminals 54 and 55.

In the duplexer of the seventh embodiment with the reception filter of the double mode type, the first conductor 46 surrounds the area defined by projecting the transmission terminal 52 and the area defined projecting the first reception terminal 54 closer to the transmission terminal 52 than the second reception terminal 55. Further, the peripheries of the transmission terminal 52 and the first reception terminal 54 are surrounded by the ground terminals 56 in the three directions. It is thus possible to reduce the electromagnetic coupling between the transmission terminal 52 and the first reception terminal 54 and to improve the isolation characteristic.

The isolation characteristic may be further improved by providing the first conductor 46 so as to surround both the areas defined by projecting the first and second reception terminals 54 and 55.

FIGS. 28A through 28F illustrate exemplary pattern variations of the lower surface of the line pattern/foot pad layer 30 having the first and second reception terminals 54 and 55. The ground terminals 56 depicted in FIGS. 28A through 28F improve the isolation characteristic.

The present invention is not limited to the specifically described embodiments but includes other embodiments and variations within the scope of the claimed invention.

What is claimed is:

1. A duplexer comprising:
   a multilayer substrate having multiple layers and having a back surface having a rectangular shape;
   an antenna terminal provided on the back surface so as to be close to a center of a first side of the back surface;
   a transmission terminal provided on the back surface so as to be close to a second side of the back surface crossing the first side and to be farther away from the antenna terminal than a center of the second side;
   a first reception terminal provided on the back surface so as to be close to a third side of the back surface opposite to the second side and to be farther away from the antenna terminal than a center of the third side;
   a first conductor provided on a first surface of a first layer out of the multiple layers so as to surround at least one of a first area defined by projecting the transmission terminal onto the first layer and a second area defined by projecting the first reception terminal thereon; and
   a ground terminal provided on a second surface of the first layer opposite to the first surface and located between the transmission terminal and a fourth side opposite to the first side and/or between the first reception terminal and the fourth side.

2. The duplexer according to claim 1, wherein the first conductor surrounds both the first area and the second area, and the ground terminal is provided between the transmission terminal and the fourth side opposite to the first side and between the first reception terminal and the fourth side.

3. The duplexer according to claim 1, wherein the ground terminal is located below the first conductor and is further provided between the transmission terminal and the second side and/or between the first reception terminal and the third side.

4. The duplexer according to claim 3, wherein:
   the first conductor surrounds both the first and second areas; and
   the ground terminal is provided between the transmission terminal and the fourth side and between the first reception terminal and the fourth side and is further provided between the transmission terminal and the second side and between the first reception terminal and the third side.

5. The duplexer according to claim 1, further comprising a second conductor located above the first conductor and provided on a second layer out of the multiple layers, the second layer being positioned above the first layer, the second layer covering at least one of a third area defined by projecting the transmission terminal onto the second layer and a fourth area defined by projecting the first reception terminal thereon.

6. The duplexer according to claim 5, wherein the second layer covers both the third area and the fourth area.

7. The duplexer according to claim 1, wherein the ground terminal is further provided close to centers of the second, third and fourth sides.

8. The duplexer according to claim 7, wherein the ground terminal is further provided in a center of the back surface of the multilayer substrate.

9. The duplexer according to claim 8, wherein the ground terminal is formed by a single-piece ground terminal or is composed of a plurality of separate terminals.

10. The duplexer according to claim 1, further comprising a transmission filter connected between the antenna terminal and the transmission terminal, and a reception filter connected between the antenna terminal and the reception terminal, wherein the transmission filter and the reception filter include acoustic wave resonators.

11. The duplexer according to claim 1, further comprising a second reception terminal next to the first reception terminal and close to the center of the third side.

12. An electronic device comprising:
   a duplexer; and a printed-circuit board on which the duplexer is mounted,
   the duplexer including:
   a multilayer substrate having multiple layers and having a back surface having a rectangular shape;
   an antenna terminal provided on the back surface so as to be close to a center of a first side of the back surface;
   a transmission terminal provided on the back surface so as to be close to a second side of the back surface crossing the first side and to be farther away from the antenna terminal than a center of the second side;
   a first reception terminal provided on the back surface so as to be close to a third side of the back surface opposite to the second side and to be farther away from the antenna terminal than a center of the third side;

a first conductor provided on a first surface of a first layer out of the multiple layers so as to surround at least one of a first area defined by projecting the transmission terminal onto the first layer and a second area defined by projecting the first reception terminal thereon; and a ground terminal provided on a second surface of the first layer opposite to the first surface and located between the transmission terminal and a fourth side opposite to the first side and/or between the first reception terminal and the fourth side, the printed-circuit board having an antenna signal line, a transmission signal line, a reception signal line and a ground line respectively connected to the antenna terminal, the transmission terminal, the first reception terminal and the ground terminal, the ground line being provided so as to surround the transmission signal line and the reception signal line.

\* \* \* \* \*